(12) United States Patent
Hinode et al.

(10) Patent No.: US 9,431,277 B2
(45) Date of Patent: Aug. 30, 2016

(54) SUBSTRATE TREATMENT METHOD AND SUBSTRATE TREATMENT APPARATUS

(71) Applicant: SCREEN Holdings Co., Ltd., Kyoto (JP)

(72) Inventors: Taiki Hinode, Kyoto (JP); Takashi Ota, Kyoto (JP); Kazuhide Saito, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/564,620

(22) Filed: Dec. 9, 2014

(65) Prior Publication Data

US 2015/0162224 A1 Jun. 11, 2015

(30) Foreign Application Priority Data

Dec. 11, 2013 (JP) .................................. 2013-256263
Dec. 11, 2013 (JP) .................................. 2013-256264

(51) Int. Cl.
 *H01L 21/311* (2006.01)
 *H01L 21/67* (2006.01)
 *H01L 29/66* (2006.01)

(52) U.S. Cl.
 CPC ...... *H01L 21/6708* (2013.01); *H01L 21/31111* (2013.01); *H01L 21/67028* (2013.01); *H01L 21/67115* (2013.01); *H01L 29/6653* (2013.01)

(58) Field of Classification Search
 None
 See application file for complete search history.

(56) References Cited

U.S. PATENT DOCUMENTS

| | | | |
|---|---|---|---|
| 7,238,295 B2* | 7/2007 | Izuta | C23F 1/46 216/83 |
| 7,591,959 B2* | 9/2009 | Li | C03C 15/00 216/83 |
| 8,883,033 B2* | 11/2014 | Chen | H01L 29/6653 216/83 |
| 2008/0179293 A1* | 7/2008 | Wei | H01L 21/31111 216/84 |
| 2012/0074102 A1 | 3/2012 | Magara et al. | 216/83 |
| 2012/0145672 A1* | 6/2012 | Ratkovich | H01L 21/31111 216/83 |
| 2013/0048215 A1* | 2/2013 | Higashi | H01L 21/67086 156/345.15 |
| 2013/0255882 A1* | 10/2013 | Takahashi | H01L 21/30604 156/345.15 |
| 2014/0113455 A1* | 4/2014 | Reimer | H01L 21/0206 438/757 |

* cited by examiner

*Primary Examiner* — Shamim Ahmed
(74) *Attorney, Agent, or Firm* — Ostrolenk Faber LLP

(57) ABSTRACT

A substrate treatment method for treating a substrate including a first silicon nitride film provided on a front surface thereof and a silicon oxide film provided on the first silicon nitride film to remove the first silicon nitride film and the silicon oxide film from the substrate includes: a first phosphoric acid treatment step of supplying a phosphoric acid aqueous solution having a predetermined first concentration to the substrate held by a substrate holding unit to treat the substrate with the first concentration phosphoric acid aqueous solution for the removal of the first silicon nitride film; and a second phosphoric acid treatment step of supplying a phosphoric acid aqueous solution having a second concentration lower than the first concentration to the substrate to treat the substrate with the second concentration phosphoric acid aqueous solution for the removal of the silicon oxide film after the first phosphoric acid treatment step.

4 Claims, 13 Drawing Sheets

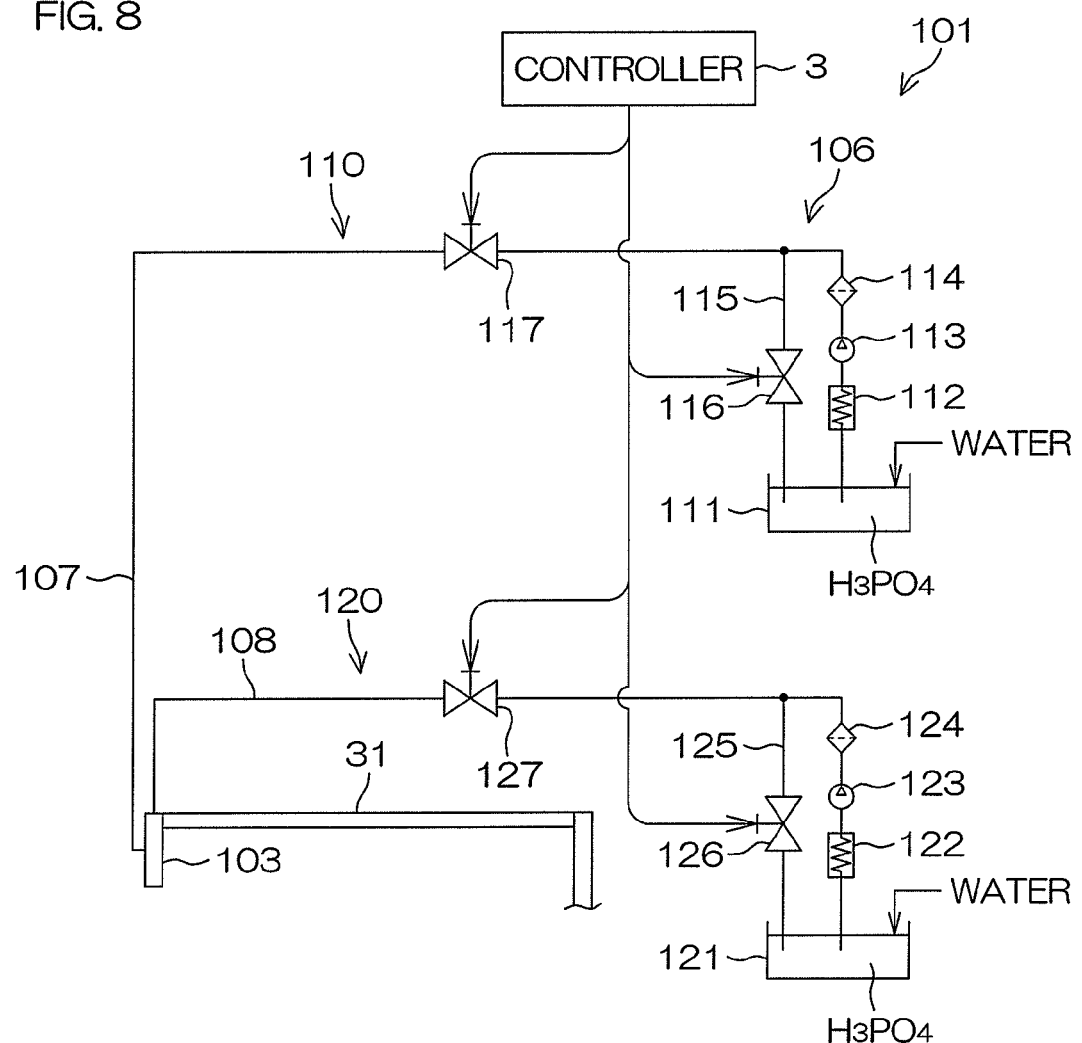

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus for treating a substrate with a treatment liquid. Examples of the substrate to be treated include semiconductor wafers, glass substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of Related Art

In production processes for semiconductor devices and the like, a higher temperature phosphoric acid aqueous solution is supplied as an etching liquid to a front surface of a substrate formed with a silicon nitride film, as required, for etching off the silicon nitride film. US Patent Application No. 2012/074102 A1 discloses a substrate treatment apparatus of a single substrate treatment type in which a phosphoric acid aqueous solution having a temperature around its boiling point is supplied to a substrate held by a spin chuck.

SUMMARY OF THE INVENTION

In a production process for a semiconductor device of MOSFET (Metal Oxide Semiconductor Field Effect Transistor) type, for example, a silicon nitride film is formed as a side wall film on a lateral side of a gate electrode of polysilicon formed on a front surface of a semiconductor wafer, and a silicon oxide film is formed over the gate electrode and the silicon nitride film. In this case, the semiconductor production process often includes an etching step of removing the silicon nitride film and the silicon oxide film from the semiconductor wafer by etching.

For the removal of the silicon oxide film, a hydrofluoric acid aqueous solution is generally used as an etching liquid. In the etching step, therefore, the hydrofluoric acid aqueous solution is first supplied to the semiconductor wafer to remove the silicon oxide film from the semiconductor wafer. As the silicon oxide film is removed, the gate electrode and the silicon nitride film are uncovered. In turn, a phosphoric acid aqueous solution is supplied to the semiconductor wafer on which the gate electrode and the silicon nitride film are uncovered, whereby the silicon nitride film is removed from the semiconductor wafer. In this case, different semiconductor apparatuses are used for the supply of the phosphoric acid aqueous solution to the semiconductor wafer and for the supply of the hydrofluoric acid aqueous solution to the semiconductor wafer.

That is, in this etching step, the substrate (semiconductor wafer) needs to be transferred between the substrate treatment apparatus for the removal of the silicon oxide film and the substrate treatment apparatus for the removal of the silicon nitride film. Therefore, the etching step for the removal of the silicon oxide film and the silicon nitride film requires a longer period of time. It is desirable to perform the etching step in a single chamber to reduce the process time.

When the phosphoric acid aqueous solution and water are mixed together and the resulting phosphoric acid aqueous solution/water mixture is supplied to a nozzle, the phosphoric acid aqueous solution/water mixture is liable to experience a bumping phenomenon due to the mixing to flow through the nozzle in a water vapor containing state. Thus, the phosphoric acid aqueous solution/water mixture is unstably spouted from the nozzle because the mixture contains water vapor. Therefore, the phosphoric acid aqueous solution/water mixture is liable to be momentarily vigorously spouted from the nozzle toward the substrate, thereby damaging the front surface of the substrate. This problem is not limited to the case in which the mixture of the phosphoric acid aqueous solution and the water is supplied to the nozzle, but will commonly arise when a mixture of two kinds of liquids (i.e., a first liquid and a second liquid) is supplied to the nozzle.

It is an object of the present invention to provide a substrate treatment method for removing a silicon oxide film and a silicon nitride film from a substrate in a shorter period of time.

It is another object of the present invention to provide a substrate treatment apparatus which is capable of removing a silicon oxide film and a silicon nitride film from a substrate in a single chamber.

It is further another object of the present invention to provide a substrate treatment apparatus which is capable of removing a gas generated in a nozzle due to the mixing of a first liquid and a second liquid from a nozzle to stably supply the mixture of the first liquid and the second liquid to a substrate.

According to a first aspect of the present invention, there is provided a substrate treatment method for treating a substrate including a first silicon nitride film provided on a front surface thereof and a silicon oxide film provided on the first silicon nitride film to remove the first silicon nitride film and the silicon oxide film from the substrate, the method including: a first phosphoric acid treatment step of causing a substrate holding unit to hold the substrate and supplying a phosphoric acid aqueous solution having a predetermined first concentration to the substrate held by the substrate holding unit to treat the substrate with the first concentration phosphoric acid aqueous solution for the removal of the first silicon nitride film; and a second phosphoric acid treatment step of supplying a phosphoric acid aqueous solution having a second concentration lower than the first concentration to the substrate to treat the substrate with the second concentration phosphoric acid aqueous solution for the removal of the silicon oxide film after the first phosphoric acid treatment step.

In this method, the first phosphoric acid treatment step of supplying the first concentration phosphoric acid aqueous solution having a relatively high concentration to the substrate is followed by the second phosphoric acid treatment step of supplying the second concentration phosphoric acid aqueous solution having a relatively low concentration to the substrate.

When a phosphoric acid aqueous solution is used at its boiling point, the etching selectivity (the ratio of the etching amount of the silicon nitride film to the etching amount of the silicon oxide film) is reduced in inversely proportional relation with the temperature increase of the phosphoric acid aqueous solution. That is, the higher concentration phosphoric acid aqueous solution can be used not only for the etching of the silicon nitride film but also for the etching of the silicon oxide film. Therefore, the silicon oxide film can be properly removed from the substrate by supplying the higher concentration phosphoric acid aqueous solution to the substrate in the first phosphoric acid treatment step. In the second phosphoric acid treatment step, the first silicon nitride film can be removed by supplying the lower concentration phosphoric acid aqueous solution to the substrate.

The first and second phosphoric acid treatment steps, which each employ the phosphoric acid aqueous solution, can be performed in a single chamber. In this case, there is no need to transfer the substrate between a plurality of chambers during the etching. Thus, the substrate treatment method makes it possible to remove the silicon oxide film and the first silicon nitride film in a shorter period of time.

Further, the first and second phosphoric acid treatment steps, which each employ the phosphoric acid aqueous solution, can be sequentially performed. In this case, the process sequence including the first and second phosphoric acid treatment steps can be performed in a shorter period of time. Thus, the process time required for performing the process sequence including the first and second phosphoric acid treatment steps can be further reduced.

According to an embodiment of the present invention, the substrate to be held by the substrate holding unit is a semiconductor substrate in which the first silicon nitride film is provided as a side wall film on a lateral side of a gate electrode of silicon, and the silicon oxide film is provided over the gate electrode and the first silicon nitride film.

In this case, if the higher concentration phosphoric acid aqueous solution is supplied to the gate electrode of silicon, the gate electrode is liable to be damaged. In the present invention, however, the first silicon nitride film is removed by using the lower concentration phosphoric acid aqueous solution in the second phosphoric acid treatment step. Therefore, the removal of the first silicon nitride film can be achieved without damaging the gate electrode. Thus, the first silicon nitride film and the silicon oxide film can be removed from the front surface of the semiconductor substrate without damaging the gate electrode.

Where the substrate further includes a second silicon nitride film provided on the silicon oxide film, the method may further include a higher concentration phosphoric acid treatment step of supplying a phosphoric acid aqueous solution having a concentration higher than the second concentration to the substrate to treat the substrate with the higher concentration phosphoric acid aqueous solution for removal of the second silicon nitride film before the first phosphoric acid treatment step.

In this method, the higher concentration phosphoric acid treatment step of supplying the higher concentration phosphoric acid aqueous solution to the substrate is performed prior to the first phosphoric acid treatment step. Thus, the second silicon nitride film can be properly removed from the substrate. Upon completion of the higher concentration phosphoric acid treatment step, a surface of the silicon oxide film is uncovered.

The first and second phosphoric acid treatment steps and the higher concentration phosphoric acid treatment step, which each employ the phosphoric acid aqueous solution, can be performed in a single chamber. Thus, the silicon oxide film and the first and second silicon nitride films can be removed in a shorter period of time.

Further, the first and second phosphoric acid treatment steps and the higher concentration phosphoric acid treatment step, which each employ the phosphoric acid aqueous solution, can be sequentially performed. In this case, the process sequence including the first and second phosphoric acid treatment steps and the higher concentration phosphoric acid treatment step can be performed in a shorter period of time.

The higher concentration phosphoric acid aqueous solution has a higher etching rate with respect to the silicon nitride film than the lower concentration phosphoric acid aqueous solution. Therefore, the process time for the higher concentration phosphoric acid treatment step can be reduced as compared with the lower concentration phosphoric acid treatment step.

Where the substrate further includes the second silicon nitride film provided on the silicon oxide film, the method may further include a lower concentration phosphoric acid treatment step of supplying a phosphoric acid aqueous solution having a concentration lower than the first concentration to the substrate to treat the substrate with the lower concentration phosphoric acid aqueous solution for the removal of the second silicon nitride film before the first phosphoric acid treatment step.

In this method, the lower concentration phosphoric acid treatment step of supplying the lower concentration phosphoric acid aqueous solution to the substrate is performed prior to the first phosphoric acid treatment step. Thus, the second silicon nitride film can be properly removed from the substrate. Upon completion of the lower concentration phosphoric acid treatment step, the surface of the silicon oxide film is uncovered.

The first and second phosphoric acid treatment steps and the lower concentration phosphoric acid treatment step, which each employ the phosphoric acid aqueous solution, can be performed in a single chamber. Thus, the silicon oxide film and the first and second silicon nitride films can be removed in a shorter period of time.

Further, the first and second phosphoric acid treatment steps and the lower concentration phosphoric acid treatment step, which each employ the phosphoric acid aqueous solution, can be sequentially performed. In this case, the process sequence including the first and second phosphoric acid treatment steps and the lower concentration phosphoric acid treatment step can be performed in a shorter period of time.

According to a second aspect of the present invention, there is provided a substrate treatment apparatus for treating a substrate including a first silicon nitride film provided on a front surface thereof and a silicon oxide film provided on the first silicon nitride film to remove the first silicon nitride film and the silicon oxide film from the substrate, the apparatus including: a chamber; a substrate holding unit provided in the chamber for holding the substrate; a phosphoric acid supplying unit which supplies a phosphoric acid aqueous solution to the substrate held by the substrate holding unit; a supply concentration adjusting unit which adjusts the concentration of the phosphoric acid aqueous solution to be supplied to the substrate; and a control unit which controls the phosphoric acid supplying unit and the supply concentration adjusting unit to perform a first phosphoric acid treatment step of supplying a phosphoric acid aqueous solution having a predetermined first concentration to the substrate held by the substrate holding unit to treat the substrate with the first concentration phosphoric acid aqueous solution for the removal of the first silicon nitride film, and a second phosphoric acid treatment step of supplying a phosphoric acid aqueous solution having a second concentration lower than the first concentration to the substrate to treat the substrate with the second concentration phosphoric acid aqueous solution for the removal of the silicon oxide film after the first phosphoric acid treatment step.

With this arrangement, the first phosphoric acid treatment step of supplying the first concentration phosphoric acid aqueous solution having a relatively high concentration to the substrate is followed by the second phosphoric acid treatment step of supplying the second concentration phosphoric acid aqueous solution having a relatively low concentration to the substrate.

When a phosphoric acid aqueous solution is used at its boiling point, the etching selectivity (the ratio of the etching amount of the silicon nitride film to the etching amount of the silicon oxide film) is reduced in inversely proportional relation with the temperature increase of the phosphoric acid aqueous solution. That is, the higher concentration phosphoric acid aqueous solution can be used not only for the etching of the silicon nitride film but also for the etching of the silicon oxide film. Therefore, the silicon oxide film can be properly removed from the substrate by supplying the higher concentration phosphoric acid aqueous solution to the substrate in the first phosphoric acid treatment step. In the second phosphoric acid treatment step, the first silicon nitride film can be removed by supplying the lower concentration phosphoric acid aqueous solution to the substrate. Therefore, the removal of the first silicon nitride film can be achieved without damaging the gate electrode.

The first and second phosphoric acid treatment steps, which each employ the phosphoric acid solution, can be performed in a single chamber. Thus, the substrate treatment apparatus makes it possible to remove the silicon oxide film and the first silicon nitride film in the single chamber.

Further, the first and second phosphoric acid treatment steps, which each employ the phosphoric acid aqueous solution, can be sequentially performed. In this case, the process sequence including the first and second phosphoric acid treatment steps can be performed in a shorter period of time. Thus, the process time required for performing the process sequence including the first and second phosphoric acid treatment steps can be reduced.

According to another embodiment of the present invention, the substrate to be held by the substrate holding unit is a semiconductor substrate in which the first silicon nitride film is provided as a side wall film on a lateral side of a gate electrode of silicon, and the silicon oxide film is provided over the gate electrode and the first silicon nitride film.

In this case, if the higher concentration phosphoric acid aqueous solution is supplied to the gate electrode of silicon, the gate electrode is liable to be damaged. In the present invention, however, the first silicon nitride film is removed by using the lower concentration phosphoric acid aqueous solution in the second phosphoric acid treatment step. Therefore, the removal of the first silicon nitride film can be achieved without damaging the gate electrode. Thus, the first silicon nitride film and the silicon oxide film can be removed from the front surface of the semiconductor substrate without damaging the gate electrode.

The phosphoric acid supplying unit may include a phosphoric acid nozzle which spouts a phosphoric acid aqueous solution, and the supply concentration adjusting unit may include a spouting concentration adjusting unit which adjusts the concentration of the phosphoric acid aqueous solution to be spouted from the phosphoric acid nozzle.

In this case, the phosphoric acid supplying unit further includes: a phosphoric acid line which supplies a phosphoric acid aqueous solution; a water supply line which supplies water; and a mixing portion connected to the phosphoric acid line and the water supply line for mixing the phosphoric acid aqueous solution supplied from the phosphoric acid line with the water supplied from the water supply line to prepare a mixed phosphoric acid aqueous solution. The mixed phosphoric acid aqueous solution prepared in the mixing portion is spouted from the phosphoric acid nozzle. The spouting concentration adjusting unit preferably includes a mixing ratio adjusting unit which adjusts a mixing ratio between the phosphoric acid aqueous solution supplied from the phosphoric acid line and the water supplied from the water supply line in the mixing portion.

With this arrangement, the mixing ratio adjusting unit adjusts the mixing ratio between the phosphoric acid aqueous solution supplied from the phosphoric acid line and the water supplied from the water supply line in the mixing portion. By the adjustment of the mixing ratio, the concentration of the phosphoric acid aqueous solution to be spouted from the phosphoric acid nozzle can be adjusted. Thus, the concentration of the phosphoric acid aqueous solution to be spouted from the phosphoric acid nozzle can be changed with a simplified construction.

The phosphoric acid supplying unit may include: a phosphoric acid nozzle which spouts a phosphoric acid aqueous solution; a first phosphoric acid supplying unit which supplies the first concentration phosphoric acid aqueous solution to the phosphoric acid nozzle; and a second phosphoric acid supplying unit which supplies the second concentration phosphoric acid aqueous solution to the phosphoric acid nozzle. The supply concentration adjusting unit includes a switching unit which switches a phosphoric acid aqueous solution supply source between the first phosphoric acid supplying unit and the second phosphoric acid supplying unit to supply the phosphoric acid aqueous solution from the supply source to the phosphoric acid nozzle.

With this arrangement, the supply source from which the phosphoric acid aqueous solution is supplied to the phosphoric acid nozzle is switched between the first phosphoric acid supplying unit and the second phosphoric acid supplying unit. Thus, the concentration of the phosphoric acid aqueous solution to be spouted from the phosphoric acid nozzle can be changed with a simplified construction.

The phosphoric acid supplying unit may include: a nozzle having a liquid inlet port into which a phosphoric acid aqueous solution and water are fed, a liquid outlet port provided at a higher position than the liquid inlet port for spouting a liquid mixture of the phosphoric acid aqueous solution and the water toward the substrate held by the substrate holding unit, an inner space including a retention space which retains the phosphoric acid aqueous solution and the water fed therein from the liquid inlet port and guides the phosphoric acid aqueous solution and the water to the liquid outlet port, and a gas outlet port through which a gas is expelled from the inner space; and a gas outlet line connected to the nozzle so that a gas generated in the inner space due to mixing of the phosphoric acid aqueous solution and the water is expelled outside the nozzle from the gas outlet port through the gas outlet line.

In this case, the liquid mixture of the phosphoric acid aqueous solution and the water is retained in the retention space. Therefore, the phosphoric acid aqueous solution/water mixture can be retained in the inner space for a longer retention period as compared with a case in which the retention space is not provided. Thus, the gas contained in the phosphoric acid aqueous solution/water mixture can be advantageously removed from the mixture. As a result, the phosphoric acid aqueous solution/water mixture has a reduced gas content and, in this state, is spouted from the liquid outlet port. Thus, the phosphoric acid aqueous solution/water mixture can be stably supplied to the substrate.

According to a third aspect of the present invention, there is provided a substrate treatment apparatus, which includes: a substrate holding unit which holds a substrate; a nozzle having a liquid inlet port into which a first liquid and a second liquid which generates a gas when being mixed with the first liquid are fed, a liquid outlet port provided at a higher position than the liquid inlet port for spouting a liquid mixture of the first liquid and the second liquid toward the substrate held by the substrate holding unit, an inner space including a retention space which retains the first liquid and the second liquid fed therein from the liquid inlet port and guides the first liquid and the second liquid to the liquid outlet port, and a gas outlet port through which the gas is expelled from the inner space; and a gas outlet line connected to the nozzle so that the gas generated in the inner space due to the mixing of the first liquid and the second liquid is expelled outside the nozzle from the gas outlet port through the gas outlet line.

With this arrangement, the first liquid and the second liquid are supplied into the inner space through the liquid inlet port, and retained in the retention space. Since the gas is generated due to the mixing of the first liquid and the second liquid, the liquid mixture of the first liquid and the second liquid (hereinafter sometimes referred to simply as "liquid mixture") flows through the inner space in a state such that the liquid mixture is mingled with the gas. Further, the nozzle is connected to the gas outlet line, so that the gas generated due to the mixing of the first liquid and the second liquid is expelled outside the nozzle through the gas outlet line.

Since the liquid mixture is retained in the retention space, the retention period during which the liquid mixture is retained in the inner space is increased as compared with a case in which the retention space is not provided. Thus, the gas contained in the liquid mixture can be advantageously removed from the liquid mixture. As a result, the liquid mixture has a reduced gas content and, in this state, is spouted from the liquid outlet port. Thus, the liquid mixture can be stably supplied to the substrate.

The retention space may be adapted to retain the liquid mixture up to the height of the liquid outlet port which is an upper limit liquid level.

According to further another embodiment of the present invention, an outflow preventing member which prevents the first liquid and the second liquid from flowing out into the gas outlet line is provided in the inner space.

The gas outlet port may be located at a higher position than the liquid outlet port. The outflow preventing member may include a partition wall which partitions the inner space into a lower space including the liquid inlet port and the retention space, and an upper space communicating with the lower space and including the gas outlet port.

With this arrangement, the lower space including the retention space and the upper space including the gas outlet port are separated by the partition wall. Therefore, the liquid mixture flowing through the inner space is substantially prevented from flowing out into the gas outlet line through the gas outlet port.

The volume of the retention space and the flow rates of the first liquid and the second liquid at which the first liquid and the second liquid flow into the retention space from the liquid inlet port may be set so that the first liquid and the second liquid flowing through the inner space are retained in the retention space for not shorter than 0.1 second.

With this arrangement, the liquid mixture can be retained in the retention space for a relatively long period of time, so that the gas can be removed in a greater amount from the liquid mixture. Thus, the liquid mixture is substantially free from the gas and, in this state, spouted from the nozzle.

The substrate treatment apparatus may further include a mixing portion in which the first liquid and the second liquid are mixed together, and a liquid mixture line which supplies a liquid mixture prepared by the mixing in the mixing portion to the nozzle. The liquid inlet port may include a liquid mixture inlet port connected to the liquid mixture line.

In this case, a suction line may be connected to the liquid mixture line for sucking the inside of the liquid mixture line. By sucking a liquid mixture remaining in the liquid mixture line, a leading liquid surface of the liquid mixture can be retracted in the liquid mixture line. Therefore, the liquid mixture is prevented from flowing into the nozzle after the spouting of the liquid mixture from the nozzle is stopped. This reliably prevents the liquid mixture from inadvertently dripping from the nozzle.

The liquid inlet port may include a first liquid inlet port into which the first liquid is fed, and a second liquid inlet port into which the second liquid is fed, the second liquid inlet port being provided separately from the first liquid inlet port.

A phosphoric acid aqueous solution and water may be used as the first liquid and the second liquid, respectively, in combination. In this case, the liquid outlet port may include a first liquid outlet port, and a second liquid outlet port located at a higher position than the first liquid outlet port. The apparatus further includes a retention space switching unit which opens and closes the first liquid outlet port to switch the retention space between a first retention space and a second retention space having a greater volume than the first retention space, the first retention space being adapted to retain the phosphoric acid aqueous solution and the water flowing therein from the liquid inlet port and guide the phosphoric acid aqueous solution and the water to the first liquid outlet port, the second retention space being adapted to retain the phosphoric acid aqueous solution and the water flowing therein from the liquid inlet port and guide the phosphoric acid aqueous solution and the water to the second liquid outlet port.

With this arrangement, when the phosphoric acid aqueous solution and the water are fed into the inner space at predetermined flow rates from the liquid inlet port, the phosphoric acid aqueous solution and the water supplied into the inner space are retained in the second retention space for a longer period of time than in the first retention space and, therefore, a greater amount of water is evaporated from the phosphoric acid aqueous solution and the water retained in the second retention space than from the phosphoric acid aqueous solution and the water retained in the first retention space. That is, the liquid mixture of the phosphoric acid aqueous solution and the water retained in the second retention space has a higher phosphoric acid concentration than the liquid mixture of the phosphoric acid aqueous solution and the water retained in the first retention space. Therefore, the concentration of the phosphoric acid aqueous solution to be spouted from the nozzle can be changed by selectively switching the retention space between the first and second retention spaces.

Thus, a phosphoric acid aqueous solution having a desired concentration according to a treatment to be performed can be supplied to the substrate.

Sulfuric acid and a hydrogen peroxide aqueous solution may be used as the first liquid and the second liquid, respectively, in combination.

The foregoing and other objects, features and effects of the present invention will become more apparent from the following detailed description of the preferred embodiments with reference to the attached drawings.

BRIEF DESCRIPTION OF THE DRAWINGS

FIG. 8 is a schematic diagram of a phosphoric acid supplying device according to a second embodiment of the present invention.

DETAILED DESCRIPTION OF PREFERRED EMBODIMENTS

Figure 1:
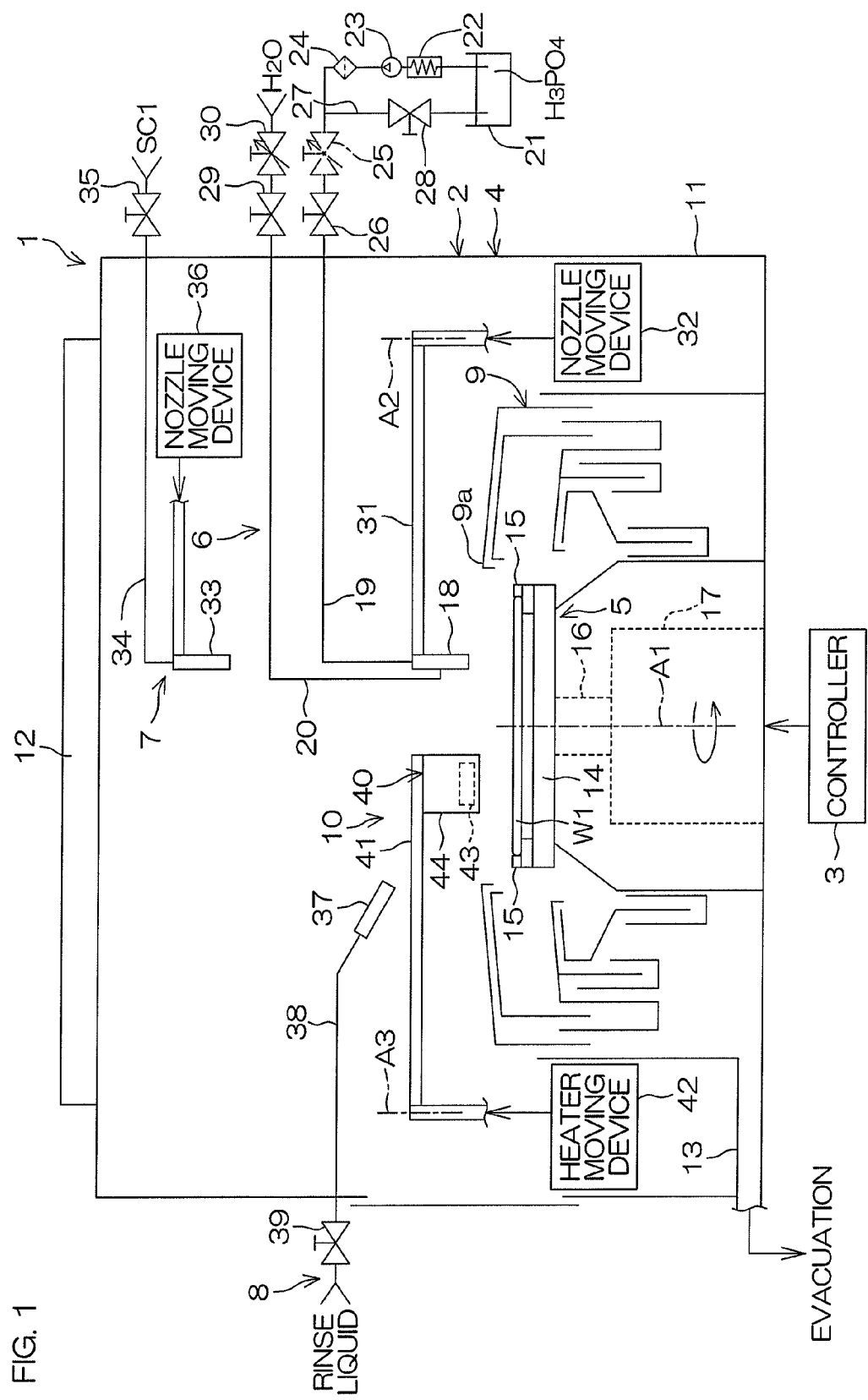
FIG. 1 is a schematic diagram showing the inside of a treatment unit of a substrate treatment apparatus according to a first embodiment of the present invention as seen horizontally.

FIG. 1 is a schematic diagram showing the inside of a treatment unit 2 of a substrate treatment apparatus 1 according to a first embodiment of the present invention as seen horizontally.

The substrate treatment apparatus 1 is of a single substrate treatment type adapted to treat a single substrate W1 at a time. The substrate W1 to be treated by the substrate treatment apparatus 1 is, for example, a round semiconductor wafer (semiconductor substrate). The substrate treatment apparatus 1 includes a plurality of treatment units 2 (only one of which is shown in FIG. 1) each adapted to etch a silicon nitride film (SiN, $Si_3N_4$ or the like) and to etch a silicon oxide film ($SiO_2$) by supplying a phosphoric acid aqueous solution (an aqueous solution containing phosphoric acid as a major component) to a front surface (upper surface) of the substrate W1 having a device formation region, and a controller (control unit) 3 which controls the operations of devices provided in the substrate treatment apparatus 1 and the opening/closing operations of valves. A single treatment unit 2 may be provided in the substrate treatment apparatus 1.

The treatment unit 2 includes a box-shaped chamber 4 having an inner space, a spin chuck (substrate holding unit) 5 which horizontally holds the substrate Win the chamber 4 and rotates the substrate W1 about a rotation axis A1 vertically extending through a center of the substrate W1, a treatment liquid supplying device (a phosphoric acid supplying device (phosphoric acid supplying unit) 6, an SC1 supplying device 7 and a rinse liquid supplying device 8) which supplies a chemical liquid (a phosphoric acid aqueous solution and SC1) and a rinse liquid to the substrate W1 , a tubular cup 9 surrounding the spin chuck 5, and a heating device 10 which heats the substrate W1.

As shown in FIG. 1, the chamber 4 includes a box-shaped partition wall 11 defining an inside space in which the spin chuck 5 and the like are accommodated, an FFU (fan filter unit) 12 provided as an air supplying unit which supplies clean air (air filtered with a filter) into the inside of the partition wall 11 from a top portion of the partition wall 11, and a gas evacuation duct 13 through which gas is expelled from the chamber 4 through a lower portion of the partition wall 11. The FFU 12 is disposed above the partition wall 11. The FFU 12 supplies the clean air downward into the chamber 4 from the top portion of the partition wall 11. The gas evacuation duct 13 is connected to a bottom of the cup 9, and guides the gas from the chamber 4 toward a gas evacuation facility provided in a factory in which the substrate treatment apparatus 1 is installed. Therefore, the FFU 12 and the gas evacuation duct 13 form a down flow (downward stream) flowing from the upper side to the lower side in the chamber 4. The substrate W1 is treated in the down flow formed in the chamber 4.

As shown in FIG. 1, the spin chuck 5 includes a disk-shaped spin base 14 held horizontally, a plurality of chuck pins 15 which horizontally hold the substrate W1 above the spin base 14, a rotation shaft 16 extending downward from a center portion of the spin base 14, and a spin motor 17 which rotates the rotation shaft 16 to rotate the substrate W1 and the spin base 14 about the rotation axis A1. The spin chuck 5 is not limited to the clamping-type chuck which holds the substrate W1 with the chuck pins 15 in contact with a peripheral surface of the substrate W1, but may be a vacuum-type chuck which is adapted to suck a back surface (lower surface, non-device-formation surface) of the substrate Won an upper surface of the spin base 14 to horizontally hold the substrate W1.

As shown in FIG. 1, the cup 9 is disposed outside the substrate W1 held by the spin chuck 5 (away from the rotation axis A1). The cup 9 surrounds the spin base 14. When the substrate W1 is rotated by the spin chuck 5 and, in this state, the treatment liquid is supplied to the substrate W1, the treatment liquid supplied to the substrate W1 is spun out around the substrate W1. When the treatment liquid is supplied to the substrate W1, an upper edge 9a of the upwardly open cup 9 is located at a higher position than the spin base 14. Therefore, the treatment liquid such as the chemical liquid or the rinse liquid spun out around the substrate W1 is received by the cup 9. Then, the treatment liquid received by the cup 9 is sent to a recovery device or a waste liquid device not shown.

As shown in FIG. 1, the phosphoric acid supplying device 6 includes a phosphoric acid nozzle (mixing portion) 18 which spouts the phosphoric acid aqueous solution toward the substrate W1 held by the spin chuck 5, a phosphoric acid tank 21 which stores the phosphoric acid aqueous solution, a phosphoric acid line 19 which supplies the phosphoric acid aqueous solution from the phosphoric acid tank 21 to the phosphoric acid nozzle 18, and a water supply line 20 which supplies water to the phosphoric acid nozzle 18. One of opposite ends of the phosphoric acid line 19 is connected to the phosphoric acid tank 21, and the other end of the phosphoric acid line 19 is connected to the phosphoric acid nozzle 18. A heater 22 which heats the phosphoric acid aqueous solution flowing through the phosphoric acid line 19 to temperature-control the phosphoric acid aqueous solution, a pump 23 which pumps up the phosphoric acid aqueous solution from the phosphoric acid tank 21 to feed the phosphoric acid aqueous solution to the phosphoric acid line 19, a filter 24 which filters the phosphoric acid aqueous solution flowing through the phosphoric acid line 19 to remove foreign matter from the phosphoric acid aqueous solution, and a phosphoric acid valve 26 which turns on and off the supply of the phosphoric acid aqueous solution to the phosphoric acid nozzle 18 from the phosphoric acid line 19 are provided in this order along a flow direction in the phosphoric acid line 19. The concentration of the phosphoric acid aqueous solution retained in the phosphoric acid tank 21 is, for example, in a range of 80% to 100%, more specifically not less than about 86%. After the startup of the treatment unit 2, the pump 23 is constantly driven.

The phosphoric acid line 19 is branched into a return line 27 at a position between the phosphoric acid valve 26 and the filter 24 so that the phosphoric acid aqueous solution flowing through the phosphoric acid line 19 can be returned into the phosphoric acid tank 21. A return valve 28 is provided in the return line 27. The phosphoric acid line 19 and the return line 27 define a circulation passage through which the phosphoric acid aqueous solution is circulated from the phosphoric acid tank 21.

The controller 3 closes the phosphoric acid valve 26 and opens the return valve 28 while driving the pump 23. Thus, the phosphoric acid aqueous solution pumped up from the phosphoric acid tank 21 flows through the heater 22, the filter 24, the return valve 28 and the return line 27 back into the phosphoric acid tank 21, whereby the phosphoric acid aqueous solution is circulated through the circulation passage from the phosphoric acid tank 21. The phosphoric acid aqueous solution thus circulated through the circulation passage from the phosphoric acid tank 21 is temperature-controlled by the heater 22 to be maintained at a desired constant temperature (e.g., in a range of 80° C. to 215° C.)

On the other hand, the controller 3 closes the return valve 28 and opens the phosphoric acid valve 26 while driving the pump 23. Thus, the phosphoric acid aqueous solution pumped up from the phosphoric acid tank 21 flows through the heater 22, the filter 24 and the phosphoric acid valve 26 into the phosphoric acid nozzle 18.

A three-way valve may be provided between the phosphoric acid valve 26 and the filter 24 in the phosphoric acid line 19, which is branched into the return line 27 via the three-way valve. In this case, the phosphoric acid aqueous solution flowing through the phosphoric acid line 19 may be selectively fed out into the phosphoric acid nozzle 18 or the return line 27 by controlling the three-way valve.

Water is supplied from a water supply source to one of opposite ends of the water supply line 20. The other end of the water supply line 20 is connected to the phosphoric acid nozzle 18. A water valve 29 for opening and closing the water supply line 20, and a water flow rate adjusting valve 30 for changing the opening degree of the water supply line 20 are provided in this order from the phosphoric acid nozzle 18 in the water supply line 20. The water to be supplied to the water supply line 20 is, for example, pure water (deionized water) not by way of limitation. Other examples of the water include carbonated water, electrolytic ion water, hydrogen water, ozone water and a hydrochloric acid aqueous solution having a dilute concentration (e.g., about 10 to about 100 ppm).

The phosphoric acid nozzle 18 is, for example, a so-called straight nozzle. The phosphoric acid nozzle 18 includes a generally hollow cylindrical casing (not shown). A tube wall of the casing has a phosphoric acid inlet port (not shown) connected to the other end of the phosphoric acid line 19, and a water inlet port (not shown) connected to the other end of the water supply line 20.

When the controller 3 opens the water valve 29, the water is supplied to the phosphoric acid nozzle 18 from the water supply line 20. The water flow rate adjusting valve 30 controls the opening degree to adjust the flow rate of the water to be supplied to the phosphoric acid nozzle 18.

The controller 3 closes the return valve 28, and opens the phosphoric acid valve 26 and the water valve 29. Thus, the phosphoric acid aqueous solution from the phosphoric acid line 19 and the water from the water supply line 20 flow into the phosphoric acid nozzle 18. The phosphoric acid aqueous solution and the water flowing into the phosphoric acid nozzle 18 are sufficiently mixed (agitated) in the phosphoric acid nozzle 18. The flow rate of the water flowing into the phosphoric acid nozzle 18 is adjusted by the opening degree control by means of the water flow rate adjusting valve 30, whereby the mixing ratio between the phosphoric acid aqueous solution from the phosphoric acid line 19 and the water from the water supply line 20 is changed. By adjusting the mixing ratio, the concentration of the phosphoric acid aqueous solution in the phosphoric acid nozzle 18 is adjusted to a predetermined concentration level. The phosphoric acid aqueous solution having a concentration thus adjusted is spouted from a spout of the phosphoric acid nozzle 18.

The phosphoric acid supplying device 6 is not necessarily required to be configured such that the phosphoric acid aqueous solution from the phosphoric acid line 19 and the water from the water supply line 20 directly flow into the phosphoric acid nozzle 18, but may be configured such that the water supply line 20 is connected to a mixing portion provided in the phosphoric acid line 19 and the phosphoric acid aqueous solution from the phosphoric acid line 19 and the water from the water supply line 20 are fed into the mixing portion.

As shown in FIG. 1, the phosphoric acid supplying device 6 further includes a nozzle arm 31 having a distal end at which the phosphoric acid nozzle 18 is attached, and a phosphoric acid nozzle moving device 32 which pivots the nozzle arm 31 about a pivot axis A2 vertically extending on a lateral side of the spin chuck 5 and vertically moves up and down the nozzle arm 31 along the pivot axis A2 to horizontally and vertically move the phosphoric acid nozzle 18. The phosphoric acid nozzle moving device 32 horizontally moves the phosphoric acid nozzle 18 between a treatment position at which the phosphoric acid nozzle 18 is located to spout the phosphoric acid aqueous solution to the upper surface of the substrate W1 and a retracted position to which the phosphoric acid nozzle 18 is retracted on a lateral side of the substrate W1 as seen in plan.

As shown in FIG. 1, the SC1 supplying device 7 includes an SC1 nozzle 33 which spouts SC1 (a liquid mixture containing $NH_4OH$ and $H_2O_2$) toward the substrate W1 held by the spin chuck 5, an SC1 line 34 which supplies the SC1 to the SC1 nozzle 33, an SC1 valve 35 which turns on and off the supply of the SC1 from the SC1 line 34 to the SC1 nozzle 33, and an SC1 nozzle moving device 36 which horizontally and vertically moves the SC1 nozzle 33. With the SC1 valve 35 being open, the SC1 supplied from the SC1 line 34 to the SC1 nozzle 33 is spouted from the SC1 nozzle 33. The SC1 nozzle moving device 36 horizontally moves the SC1 nozzle 33 between a treatment position at which the SC1 nozzle 33 is located to spout the SC1 to the upper surface of the substrate W1 and a retracted position to which the SC1 nozzle 33 is retracted on a lateral side of the substrate W1 as seen in plan.

As shown in FIG. 1, the rinse liquid supplying device 8 includes a rinse liquid nozzle 37 which spouts the rinse liquid toward the substrate W1 held by the spin chuck 5, a rinse liquid line 38 which supplies the rinse liquid to the rinse liquid nozzle 37, and a rinse liquid valve 39 which turns on and off the supply of the rinse liquid from the rinse liquid line 38 to the rinse liquid nozzle 37. The rinse liquid nozzle 37 is a fixed nozzle which spouts the rinse liquid with a spout of the rinse liquid nozzle 37 kept stationary. Alternatively, the rinse liquid supplying device 8 may include a rinse liquid nozzle moving device which moves the rinse liquid nozzle 37 to move a rinse liquid applying position on the upper surface of the substrate W1.

With the rinse liquid valve 39 being open, the rinse liquid supplied to the rinse liquid nozzle 37 from the rinse liquid line 38 is spouted from the rinse liquid nozzle 37 toward a center portion of the upper surface of the substrate W1. The rinse liquid is, for example, pure water (deionized water) not by way of limitation. Other examples of the rinse liquid include carbonated water, electrolytic ion water, hydrogen water, ozone water, IPA (isopropyl alcohol) and a hydrochloric acid aqueous solution having a dilute concentration (e.g., about 10 to about 100 ppm).

As shown in FIG. 1, the heating device 10 includes a radiation heating device which heats the substrate W1 by radiation. The radiation heating device includes an infrared heater 40 which irradiates the substrate W1 with infrared radiation, a heater arm 41 having a distal end to which the infrared heater 40 is attached, and a heater moving device 42 which moves the heater arm 41.

The infrared heater 40 includes an infrared lamp 43 (also see FIG. 5) which emits the infrared radiation, and a lamp housing 44 which accommodates the infrared lamp 43.

The infrared lamp 43 is disposed in the lamp housing 44. The lamp housing 44 has a smaller size than the substrate W1 seen in plan. Therefore, the infrared lamp 43 disposed in the lamp housing 44 has a smaller size than the substrate W1 seen in plan. The infrared lamp 43 and the lamp housing 44 are attached to the heater arm 41. Therefore, the infrared lamp 43 and the lamp housing 44 are moved together with the heater arm 41.

The infrared lamp 43 includes a filament, and a quartz tube which accommodates the filament. In the heating device 10, the infrared lamp 43 (e.g., halogen lamp) may be a carbon heater or other heat generator. At least a part of the lamp housing 44 is made of a light transmissive and heat resistant material such as quartz. Light to be emitted from the infrared lamp 43 includes the infrared radiation. The light including the infrared radiation is transmitted through the lamp housing 44 to be outputted from the outer surface of the lamp housing 44, or heats the lamp housing 44 to emit radiant light from the outer surface of the lamp housing 44. The substrate W1 and a liquid film of the phosphoric acid aqueous solution retained on the upper surface of the substrate W1 are heated by the transmitted light and the radiant light outputted from the outer surface of the lamp housing 44.

The heater moving device 42 retains the infrared heater 40 at a predetermined height. The heater moving device 42 vertically moves the infrared heater 40. Further, the heater moving device 42 pivots the heater arm 41 about a pivot axis A3 vertically extending on a lateral side of the spin chuck 5, whereby the infrared heater 40 is moved in a horizontal plane above the spin chuck 5.

Figure 2:
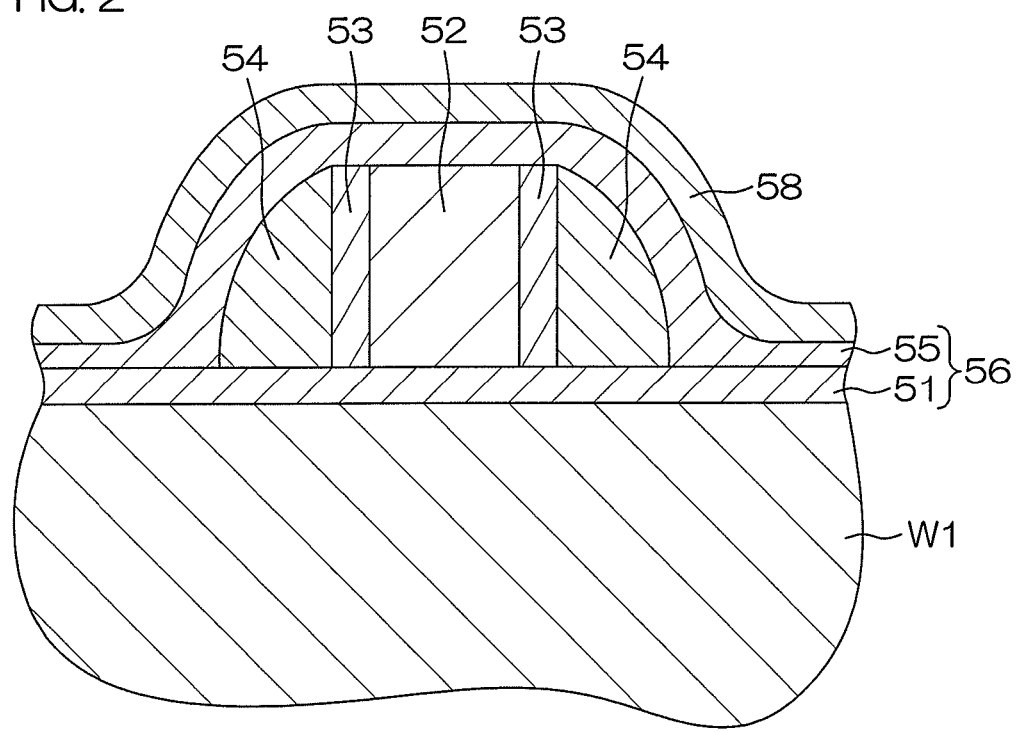
FIG. 2 is a sectional view showing a part of a front surface of a substrate to be treated by the treatment unit on an enlarged scale.

FIG. 2 is a sectional view showing a part of the front surface of the substrate W1 to be treated by the treatment unit 2 on an enlarged scale.

The substrate W1 to be treated is a base of a MOSFET. On the substrate W1, a first silicon oxide film 51 of a TEOS (tetraethyl orthosilicate) film is provided as an exemplary silicon oxide film. A gate electrode 52 of polysilicon (silicon) is provided on a surface of the first silicon oxide film 51. On the first silicon oxide film 51, the gate electrode 52 has a thermal oxide film (exemplary silicon oxide film) provided as an offset spacer 53 in side surfaces thereof as surrounding the side surfaces. The offset spacer 53 has a thickness of several nanometers to several tens nanometers as measured laterally. The side surfaces of the gate electrode 52 are surrounded by the offset spacer 53. A first silicon nitride film 54 is provided as a side wall (side wall film) on the lateral sides of the gate electrode 52 with the intervention of the offset spacer 53. The first silicon nitride film 54 is made of, for example, SiN or $Si_3N_4$ (in this embodiment, SiN).

A second silicon oxide film 55 of a deposited TEOS film (exemplary silicon oxide film) is provided over the gate electrode 52, the offset spacer 53 and the first silicon nitride film 54. The second silicon oxide film 55 is provided over the entire substrate W1 and, therefore, covers not only the gate electrode 52, the offset spacer 53 and the first silicon nitride film 54, but also a portion of the first silicon oxide film 51 present on lateral sides of the gate electrode 52 and the like. Hereinafter, the first silicon oxide film 51 and the second silicon oxide film 55 are sometimes collectively referred to as silicon oxide film 56.

A second silicon nitride film 58 of a deposited silicon nitride film is provided on the second silicon oxide film 55. The second silicon nitride film 58 is provided over the entire substrate W1. The second silicon nitride film 58 is, for example, made of SiN or $Si_3N_4$ (in this embodiment, SiN).

Figure 3:
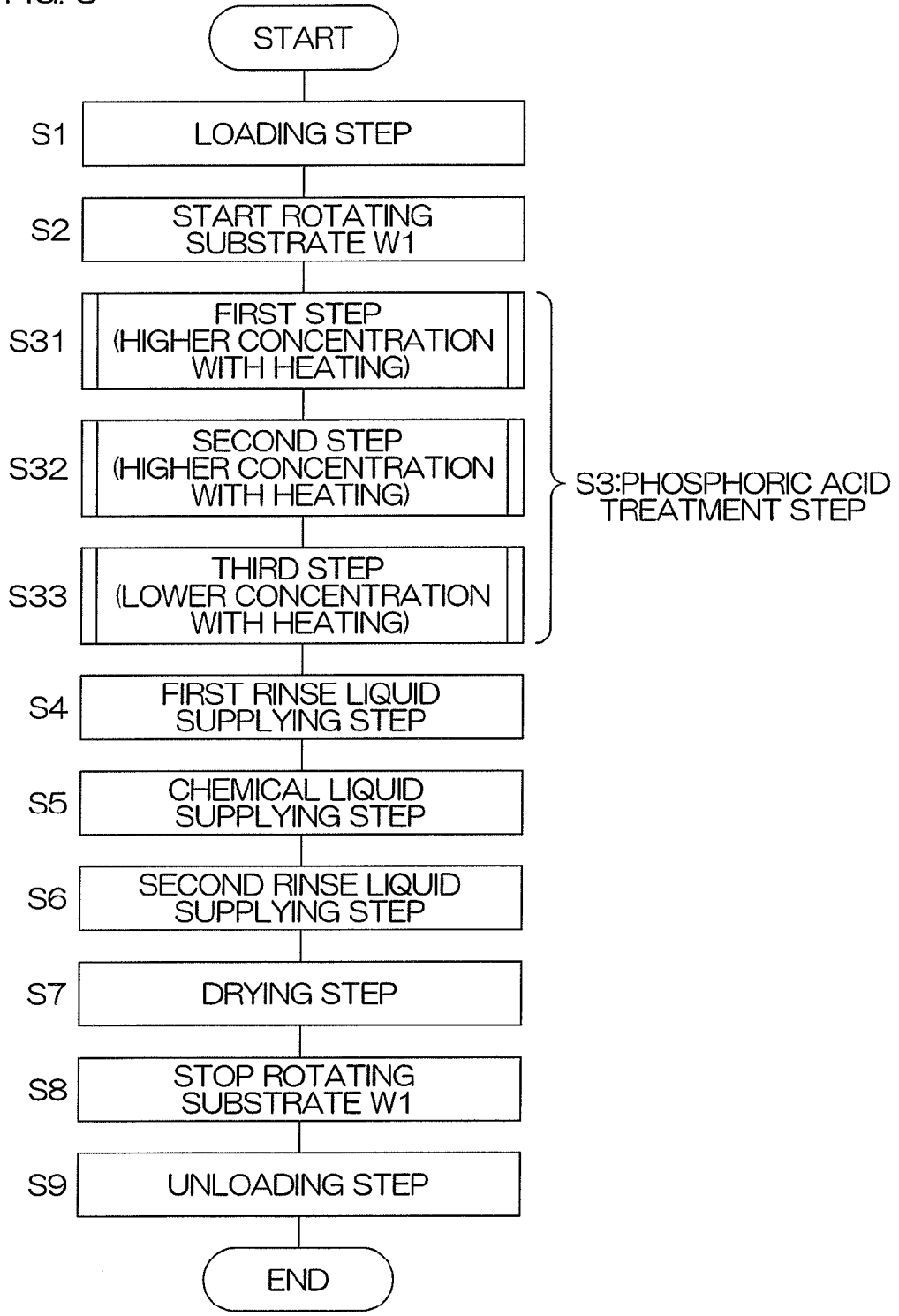
FIG. 3 is a flow chart for explaining an exemplary treatment process to be performed by the treatment unit.
Figure 4:
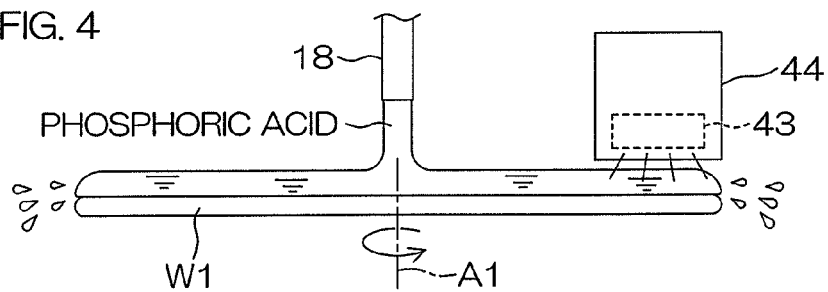
FIG. 4 is a schematic diagram of a substrate being subjected to a phosphoric acid treatment step as seen horizontally.
Figure 5:
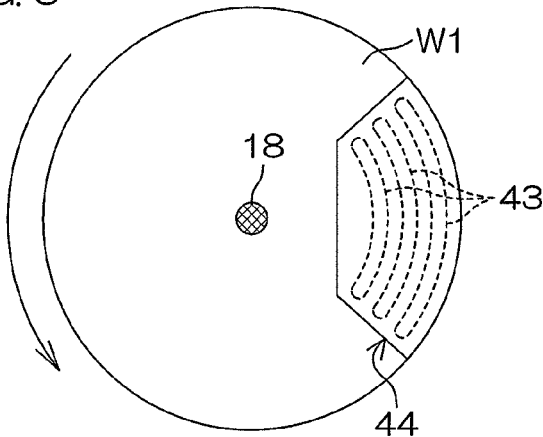
FIG. 5 is a schematic plan view of the substrate being subjected to the phosphoric acid treatment step.
Figure 6:
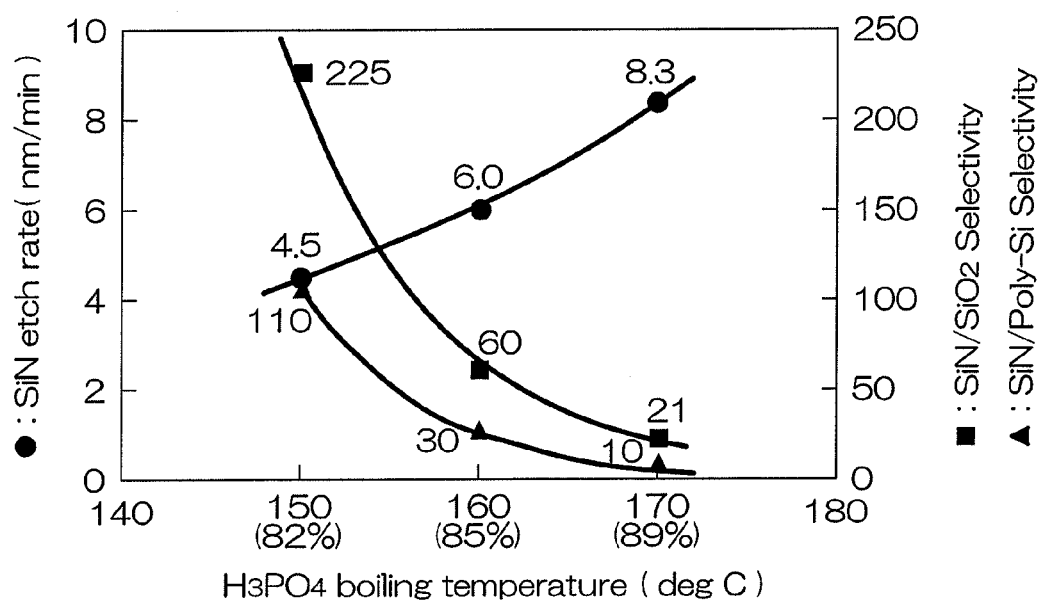
FIG. 6 is a graph showing relationships between the temperature of a phosphoric acid aqueous solution supplied to the substrate, and an etching rate and etching selectivities.
Figure 7A:
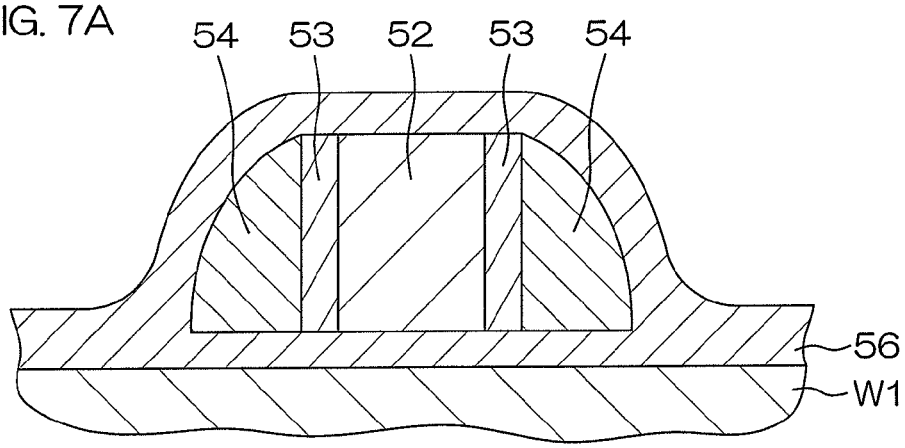
FIG. 7A is a schematic diagram showing a major portion of the substrate after a first step of the phosphoric acid treatment step.
Figure 7B:
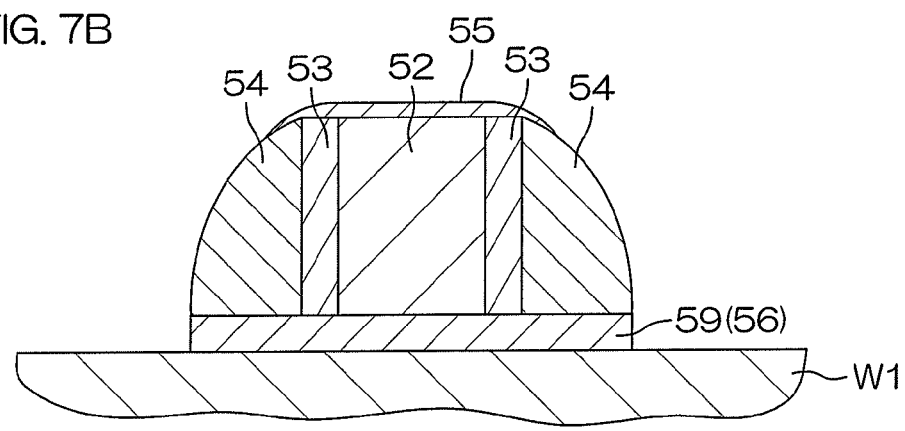
FIG. 7B is a schematic diagram showing the major portion of the substrate after a second step of the phosphoric acid treatment step.
Figure 7C:
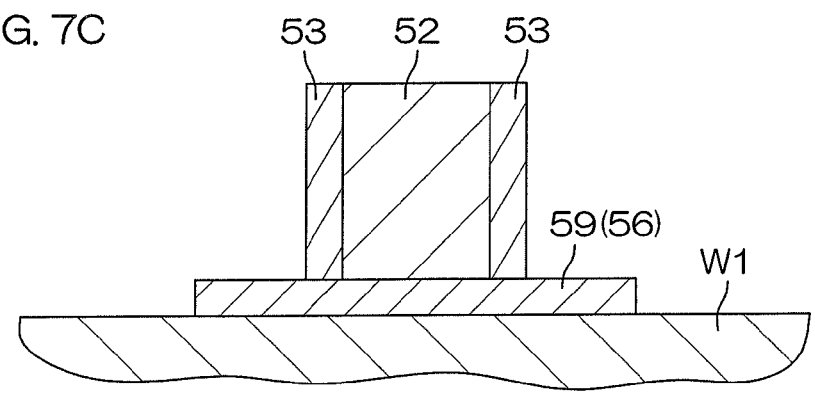
FIG. 7C is a schematic diagram showing the major portion of the substrate after a third step of the phosphoric acid treatment step.

FIG. 3 is a flow chart for explaining an exemplary treatment process to be performed by the treatment unit 2. FIGS. 4 and 5 are schematic diagrams of a substrate W1 being subjected to a phosphoric acid treatment step (S3). FIG. 6 is a graph showing relationships between the concentration of the phosphoric acid aqueous solution supplied to the substrate W1, and the etching rate of the silicon nitride film, an $SiN/SiO_2$ etching selectivity (the ratio of the etching amount of the silicon nitride film to the etching amount of the silicon oxide film) and an SiN/Poly-Si etching selectivity (the ratio of the etching amount of the silicon nitride film to the etching amount of the polysilicon). In FIG. 6, the etching rate and the etching selectivities observed when the phosphoric acid aqueous solution was used at its boiling point are shown. FIG. 6 is based on a case in which an LP-SiN (Low Pressure CVD of Silicon Nitride) film was used as the silicon nitride film, and a thermal oxide film was used as the silicon oxide film. FIGS. 7A, 7B and 7C are schematic diagrams showing a major portion of the substrate W1 observed after process steps (S31, S32, S33) of the phosphoric acid treatment step (S3).

Hereinafter, reference is made to FIGS. 1 and 2 and, as required, also to FIGS. 3 to 7C.

When a substrate W1 is to be treated in the treatment unit 2, a substrate loading step (Step S1 in FIG. 3) is performed to load the substrate W1 into the chamber 4. More specifically, the controller 3 causes a transport robot (not shown) to hold the substrate Won its hands and move the hands into the chamber 4 with all the nozzles being retracted from above the spin chuck 5. Then, the controller 3 causes the transport robot to place the substrate Won the spin chuck 5. Thereafter, the controller 3 causes the spin chuck 5 to hold the substrate W1. In turn, the controller 3 causes the spin chuck 5 to start rotating the substrate W1 (Step S2 in FIG. 3). The rotation speed of the substrate W1 is increased to a predetermined phosphoric acid treatment rotation speed (e.g., 30 to 300 rpm, more specifically about 100 rpm), and maintained at the phosphoric acid treatment rotation speed. After the substrate W1 is placed on the spin chuck 5, the controller 3 retracts the hands of the transport robot from the chamber 4.

Subsequently, the phosphoric acid treatment step (Step S3 in FIG. 3) is performed to supply the phosphoric acid aqueous solution to the substrate W1. More specifically, the controller 3 controls the phosphoric acid nozzle moving device 32 to move the phosphoric acid nozzle 18 from the retracted position to above the substrate W1. Thus, the phosphoric acid nozzle 18 is located at the treatment position (on the rotation axis A1 of the substrate W1 above the substrate W1). After the phosphoric acid nozzle 18 is located at the treatment position, the controller 3 closes the return valve 28 and opens the phosphoric acid valve 26 and the water valve 29. Thus, the phosphoric acid aqueous solution from the phosphoric acid line 19 and the water from the water supply line 20 flow into the phosphoric acid nozzle 18. The phosphoric acid aqueous solution and the water thus flowing into the phosphoric acid nozzle 18 are mixed together in the phosphoric acid nozzle 18, whereby a phosphoric acid aqueous solution having a concentration adjusted to a predetermined concentration level is spouted from the spout of the phosphoric acid nozzle 18.

The phosphoric acid aqueous solution spouted from the phosphoric acid nozzle 18 is applied to a center portion of an upper surface of the rotating substrate W1, and then flows radially outward on the upper surface of the substrate W1 by a centrifugal force. Therefore, the phosphoric acid aqueous solution is supplied over the entire upper surface of the substrate W1, which is thereby covered with a liquid film of the phosphoric acid aqueous solution. Thus, the upper surface of the substrate W1 is etched with the phosphoric acid aqueous solution.

Further, the phosphoric acid aqueous solution scatters around the substrate W1, and is received by the cup 9 to be guided to the recovery device via the cup 9. Then, the phosphoric acid aqueous solution guided to the recovery device is supplied again to the substrate W1. This reduces the use amount of the phosphoric acid aqueous solution.

In the phosphoric acid treatment step (S3), a heating step is also performed to heat the phosphoric acid aqueous solution on the substrate W1. More specifically, the controller 3 causes the infrared heater 40 to start emitting light. Thereafter, the controller 3 controls the heater moving device 42 to horizontally move the infrared heater 40 from the retracted position to above the substrate W1, and keep the infrared heater 40 still at the treatment position on the rotation axis A1 as shown in FIGS. 4 and 5. With the infrared heater 40 located at the treatment position, the controller 3 may keep the infrared heater 40 still with a substrate opposing surface of the infrared heater 40 in contact with the liquid film of the phosphoric acid aqueous solution retained on the substrate W1, or may keep the infrared heater 40 still with a lower surface of the infrared heater 40 spaced a predetermined distance from the liquid film of the phosphoric acid aqueous solution on the substrate W1 as shown in FIG. 4.

The heating temperature of the substrate W1 to be heated by the infrared heater 40 is set not lower than the boiling point of the phosphoric acid aqueous solution of the specific concentration present on the substrate W1 (e.g., a predetermined temperature in a range of 150° C. to 190° C.) Therefore, the phosphoric acid aqueous solution of the specific concentration present on the substrate W1 is heated up to its boiling point, and maintained in a boiling state. Particularly, where the heating temperature of the substrate W1 to be heated by the infrared heater 40 is set higher than the boiling point of the phosphoric acid aqueous solution of the specific concentration, a temperature at an interface between the substrate W1 and the phosphoric acid aqueous solution is maintained at a temperature higher than the boiling point, thereby promoting the etching of the substrate W1.

In the heating step, the infrared heater 40 located above the substrate W1 may be moved along the upper surface of the substrate W1 between a center portion of the substrate W1 and the middle of a peripheral portion of the substrate W1.

Where the phosphoric acid aqueous solution is used at its boiling point, as shown in FIG. 6, the $SiN/SiO_2$ etching selectivity and the SiN/Poly-Si etching selectivity are reduced in inversely proportional relation with the increase in the concentration of the phosphoric acid aqueous solution. More specifically, the $SiN/SiO_2$ etching selectivity and the SiN/Poly-Si etching selectivity are 225 and 110, respectively, for a phosphoric acid concentration of 82% (lower concentration), 60 and 30, respectively, for a phosphoric acid concentration of 85% (higher concentration), and 21 and 10, respectively, for a phosphoric acid concentration of 89% (higher concentration).

Since the lower concentration phosphoric acid aqueous solution has a higher $SiN/SiO_2$ etching selectivity, it is possible to selectively remove the silicon nitride film substantially without removing the silicon oxide film. Where a silicon oxide film having a smaller allowable etching loss (e.g., the offset spacer 53 of the thermal oxide film) is exposed in the upper surface of the substrate W1, or is provided under the silicon nitride film, therefore, the silicon nitride film can be selectively removed from the upper surface of the substrate W1 without damaging the silicon oxide film by using the lower concentration phosphoric acid aqueous solution.

Further, the lower concentration phosphoric acid aqueous solution has a higher SiN/Poly-Si etching selectivity, making it possible to selectively remove the silicon nitride film substantially without removing the polysilicon. Where polysilicon having a smaller allowable etching loss (e.g., the gate electrode 52) is exposed in the upper surface of the substrate W1, or is provided under the silicon nitride film, therefore, the silicon nitride film can be selectively removed from the upper surface of the substrate W1 without damaging the polysilicon by using the lower concentration phosphoric acid aqueous solution.

The higher concentration phosphoric acid aqueous solution has a lower $SiN/SiO_2$ etching selectivity and, therefore, is used for positively removing the silicon oxide film (e.g., second silicon oxide film 55) from the upper surface of the substrate W1.

As described above, FIG. 6 is a graph obtained when the thermal oxide film was used as the silicon oxide film. The TEOS film used as the silicon oxide film is more easily etched with the phosphoric acid aqueous solution than the thermal oxide film. When the TEOS film used as the silicon oxide film is etched with the higher concentration phosphoric acid aqueous solution (having a concentration of 89%), the selectivity is about 7. That is, the higher concentration phosphoric acid aqueous solution can be used not only for etching the silicon nitride film but also for etching the silicon oxide film of the TEOS film.

The etching rate of the silicon nitride film is increased as the concentration of the phosphoric acid aqueous solution increases.

The phosphoric acid treatment step (Step S3 in FIG. 3) includes a first step (higher concentration phosphoric acid treatment step (Step S31 in FIG. 3)) of supplying a phosphoric acid aqueous solution having a predetermined higher concentration (about 86%) to the substrate W1, a second step (first phosphoric acid treatment step (S32 in FIG. 3) of supplying a phosphoric acid aqueous solution having a predetermined higher concentration (first concentration, about 86%) to the substrate W1 after the first step (S31), and a third step (second phosphoric acid treatment step (S33 in FIG. 3) of supplying a phosphoric acid aqueous solution having a predetermined lower concentration (second concentration, about 82%) to the substrate W1after the second step (S32). In the first step (S31), the second silicon nitride film 58 provided as the outermost layer is removed from the upper surface of the substrate W1. In the second step (S32), the silicon oxide film 56 is partly removed from the upper surface of the substrate W1 after the removal of the second silicon nitride film 58. In the third step (S33), the first silicon nitride film 54 is removed from the upper surface of the substrate W1 after the removal of a part of the silicon oxide film 56 and the second silicon nitride film 58.

At the beginning of the phosphoric acid treatment step (S3), the first step (S31) is performed. In the first step (S31), the phosphoric acid valve 26 and the water valve 29 are opened, whereby the phosphoric acid aqueous solution from the phosphoric acid line 19 and the water from the water supply line 20 are supplied to the phosphoric acid nozzle 18. Before the opening of the phosphoric acid valve 26 and the water valve 29, the opening degree of the water flow rate adjusting valve 30 is controlled so that the concentration of the phosphoric acid aqueous solution to be spouted from the phosphoric acid nozzle 18 is set to the predetermined higher concentration level (e.g., a concentration of about 86% so as to adjust the etching selectivity to about 50). Therefore, the concentration of the phosphoric acid aqueous solution is adjusted to the higher concentration level (about 86%) in the phosphoric acid nozzle 18, and the phosphoric acid aqueous solution thus concentration-adjusted is spouted from the spout of the phosphoric acid nozzle 18.

In the first step (S31), the second silicon nitride film 58 provided as the outermost layer is etched by supplying the higher concentration phosphoric acid aqueous solution to the substrate W1. The process time of the first step (S31) is predetermined so that the second silicon nitride film 58 can be substantially entirely removed. As shown in FIG. 6, the higher concentration phosphoric acid aqueous solution has a higher etching rate, so that the second silicon nitride film 58 can be removed at a higher efficiency.

After a lapse of the predetermined process time, the controller 3 ends the first step (S31), and starts the second step (S32) while continuously spouting the phosphoric acid aqueous solution from the phosphoric acid nozzle 18. At the end of the first step (S31), as shown in FIG. 7A, the second silicon nitride film 58 is substantially entirely removed from the substrate W1. As a result, the surface of the silicon oxide film 56 of the TEOS film is uncovered.

In the second step (S32) of this exemplary treatment process, the concentration of the phosphoric acid aqueous solution to be spouted from the phosphoric acid nozzle 18 is set to a higher concentration level, more specifically, set to the same level (about 86%) as in the first step (S31). At the beginning of the second step (S32), therefore, the concentration of the phosphoric acid aqueous solution to be spouted from the phosphoric acid nozzle 18 is not changed, so that the opening degree of the water flow rate adjusting valve 30 is not changed.

Since the higher concentration phosphoric acid aqueous solution has a lower $SiN/SiO_2$ etching selectivity, the silicon oxide film 54 of the TEOS film can be properly etched. In the second step (S32), the silicon oxide film 56 except a portion thereof present below the gate electrode 52, the offset spacer 53 and the first silicon nitride film 54 (hereinafter referred to as "the portion thereof present below the gate electrode 52 and the like") is etched.

The process time of the second step (S32) is predetermined so that the silicon oxide film 56 except the portion thereof present below the gate electrode 52 and the like can be substantially entirely removed, and a very small part of the silicon oxide film 55 remains on the upper surfaces of the gate electrode 52 and the offset spacer 53. After a lapse of the predetermined process time, the controller 3 ends the second step (S32), and starts the third step (S33) while continuously spouting the phosphoric acid aqueous solution from the phosphoric acid nozzle 18.

At the end of the second step (S32), as shown in FIG. 7B, the silicon oxide film 56 except the portion thereof present below the gate electrode 52 and the like is substantially entirely removed. As a result, the surfaces of the gate electrode 52, the offset spacer 53 and the first silicon nitride film 54 are substantially exposed through the very small part of the silicon oxide film 55 remaining thereon. In the second step (S32), the silicon oxide film 56 is also removed from the lateral sides of the gate electrode 52 and the like on the front surface of the substrate W1. That is, only the portion of the silicon oxide film 56 present below the gate electrode 52 and the like remains, and the remaining silicon oxide film serves as a gate oxide film 59.

At the beginning of the third step (S33), the controller 3 increases the opening degree of the water flow rate adjusting valve 30 to increase the flow rate of the water to be supplied to the phosphoric acid nozzle 18. Thus, the concentration of the phosphoric acid aqueous solution to be adjusted in the phosphoric acid nozzle 18 is change to the predetermined lower concentration level (e.g., a concentration of about 82% so as to adjust the etching selectivity to about 200). Thus, the concentration of the phosphoric acid aqueous solution to be spouted from the phosphoric acid nozzle 18 can be changed to the lower concentration level (about 82%).

In the third step (S33), the first silicon nitride film 54 are etched by supplying the lower concentration phosphoric acid aqueous solution to the substrate W1. The process time of the third step (S33) is predetermined so that the first silicon nitride film 54 and the very small part of the second silicon oxide film 55 remaining on the upper surfaces of the gate electrode 52, the offset spacer 53 and the first silicon nitride film 54 can be substantially entirely removed. After a lapse of the predetermined process time, the third step (S33) ends. At the end of the third step (S33), as shown in FIG. 7C, the very small part of the second silicon oxide film 55 and the first silicon nitride film 54 are substantially entirely removed from the substrate W1. Since the lower concentration phosphoric acid aqueous solution has a higher $SiN/SiO_2$ etching selectivity and a higher SiN/Poly-Si etching selectivity, it is possible to minimize the etching loss of the gate electrode 52 (polysilicon) and the offset spacer 53 (thermal silicon oxide film) caused by the phosphoric acid aqueous solution in the third step (S33). As a result of the phosphoric acid treatment step (S3), a structure including the gate oxide film 59 provided on the front surface of the substrate W1, the gate electrode 52 provided on the gate oxide film 59, and the offset spacer 53 provided on the lateral sides of the gate electrode 52 can be provided.

At the end of the third step (S33), the controller 3 closes the phosphoric acid valve 26 and the water valve 29 to stop spouting the phosphoric acid aqueous solution from the phosphoric acid nozzle 18. At the end of the third step (S33), the phosphoric acid treatment step (S3) ends.

In turn, a first rinse liquid supplying step (Step S4 in FIG. 3) is performed to supply the rinse liquid to the substrate W1. More specifically, the controller 3 opens the rinse liquid valve 39 to spout the rinse liquid toward the upper surface center portion of the substrate W1 from the rinse liquid nozzle 37 while rotating the substrate W1. Thus, a liquid film of the rinse liquid is formed as covering the entire upper surface of the substrate W1, whereby the phosphoric acid aqueous solution remaining on the upper surface of the substrate W1 is rinsed away with the rinse liquid. After a lapse of a predetermined period from the opening of the rinse liquid valve 39, the controller 3 closes the rinse liquid valve 39 to stop spouting the rinse liquid.

Then, a chemical liquid supplying step (Step S5 in FIG. 3) is performed to supply the SC1 (exemplary chemical liquid) to the substrate W1. More specifically, the controller 3 controls the SC1 nozzle moving device 36 to move the SC1 nozzle 33 from the retracted position to the treatment position. After the SC1 nozzle 33 is located above the substrate W1, the controller 3 opens the SC1 valve 35 to spout the SC1 from the SC1 nozzle 33 toward the upper surface of the rotating substrate W1. In this state, the controller 3 controls the SC1 nozzle moving device 36 to reciprocally move an SC1 applying position on the upper surface of the substrate W1 between the center portion and the peripheral portion of the upper surface of the substrate W1. After a lapse of a predetermined period from the opening of the SC1 valve 35, the controller 3 closes the SC1 valve 35 to stop spouting the SC1. Thereafter, the controller 3 controls the SC1 nozzle moving device 36 to retract the SC1 nozzle 33 from above the substrate W1.

The SC1 spouted from the SC1 nozzle 33 is applied on the upper surface of the substrate W1, and then flows outward on the upper surface of the substrate W1 by a centrifugal force. Therefore, the rinse liquid on the substrate W1 is forced outward by the SC1 to be expelled around the substrate W1. Thus, the rinse liquid film on the substrate W1 is replaced with a liquid film of the SC1 covering the entire front surface of the substrate W1. Further, the controller 3 moves the SC1 applying position on the upper surface of the substrate W1 between the center portion and the peripheral portion of the upper surface of the substrate W1 while rotating the substrate W1. Therefore, the SC1 applying position is moved over the entire upper surface of the substrate W1. Thus, the entire upper surface of the substrate W1 is scanned. Therefore, the SC1 spouted from the SC1 nozzle 33 is directly sprayed over the entire upper surface of the substrate W1, whereby the entire upper surface of the substrate W1 is uniformly treated.

Subsequently, a second rinse liquid supplying step (Step S6 in FIG. 3) is performed to supply the rinse liquid to the substrate W1. More specifically, the controller 3 opens the rinse liquid valve 39 to spout the rinse liquid from the rinse liquid nozzle 37 toward the upper surface center portion of the substrate W1 while rotating the substrate W1. Thus, the SC1 present on the substrate W1 is forced outward by the rinse liquid to be expelled around the substrate W1. Therefore, the SC1 liquid film present on the substrate W1 is replaced with a liquid film of the rinse liquid covering the entire upper surface of the substrate W1. After a lapse of a predetermined period from the opening of the rinse liquid valve 39, the controller 3 closes the rinse liquid valve 39 to stop spouting the rinse liquid.

Then, a drying step (Step S7 in FIG. 3) is performed to dry the substrate W1. More specifically, the controller 3 controls the spin chuck 5 to accelerate the rotation of the substrate W1 to rotate the substrate W1 at a rotation speed (e.g., 500 to 3000 rpm) higher than the rotation speed employed in the second rinse liquid supplying step and the preceding steps. Thus, a greater centrifugal force is applied to the liquid present on the substrate W1, so that the liquid adhering to the substrate W1 is spun out around the substrate W1. In this manner, the liquid is removed from the substrate W1, whereby the substrate W1 is dried. After a lapse of a predetermined period from the start of the higher speed rotation of the substrate W1, the controller 3 controls the spin chuck 5 to stop the rotation of the substrate W1 (Step S8 in FIG. 3).

Subsequently, an unloading step (Step S9 in FIG. 3) is performed to unload the substrate W1 from the chamber 4. More specifically, the controller 3 controls the spin chuck 5 to release the substrate W1. Thereafter, the controller 3 controls the transport robot to move the hands into the chamber 4 with all the nozzles being retracted from above the spin chuck 5. Then, the controller 3 causes the hands of the transport robot to hold the substrate W1 present on the spin chuck 5. Thereafter, the controller 3 retracts the hands of the transport robot from the chamber 4. Thus, the treated substrate W1 is unloaded from the chamber 4.

According to the first embodiment, as described above, the phosphoric acid treatment step (S3) includes the first step (S31) of supplying the higher concentration phosphoric acid aqueous solution (having a concentration of about 86%) to the substrate W1, the second step (S32) of supplying the higher concentration phosphoric acid aqueous solution (having a concentration of about 86%) to the substrate W1 after the first step (S31), and the third step (S33) of supplying the lower concentration phosphoric acid aqueous solution (having a concentration of about 82%) to the substrate W1 after the second step (S32).

Where the phosphoric acid aqueous solution is used at its boiling point, the etching selectivity (the ratio of the etching amount of the silicon nitride film to the etching amount of the silicon oxide film) is reduced in inversely proportional relation with the increase in the concentration of the phosphoric acid aqueous solution. That is, the higher concentration phosphoric acid aqueous solution can be used not only for the etching of the silicon nitride film but also for the etching of the silicon oxide film. Therefore, the silicon oxide film 56 can be properly removed from the substrate W1 by supplying the higher concentration phosphoric acid aqueous solution (having a concentration of about 86%) to the substrate W1 in the second step. Further, the SiN/Poly-Si etching selectivity (the ratio of the etching amount of the silicon nitride film to the etching amount of polysilicon) of the lower concentration phosphoric acid aqueous solution is higher. In the third step (S33), the lower concentration phosphoric acid aqueous solution (having a concentration of about 82%) is used for the removal of the first silicon nitride film 54. Therefore, the first silicon nitride film 54 can be selectively removed without damaging the gate electrode 52 (polysilicon)

Further, the first step (S31) is performed to supply the higher concentration phosphoric acid aqueous solution to the substrate W1 prior to the second step (S32). Thus, the second silicon nitride film 58 can be properly removed from the substrate W1.

The first to third steps (S31 to S33) each employ the phosphoric acid aqueous solution and, therefore, can be performed in the single chamber 4. In this case, there is no need to transfer the substrate W1 between plural chambers in the etching process. Thus, the substrate treatment method makes it possible to remove the silicon oxide film 56 and the first silicon nitride film 54 in a shorter period of time.

Further, the first to third steps (S31 to S33) each employing the phosphoric acid aqueous solution are sequentially performed, so that the phosphoric acid treatment step (S3) including the first to third steps (S31 to S33) can be performed in a further shorter period of time.

According to the first embodiment, the higher concentration phosphoric acid aqueous solution (having a concentration of about 86%) is supplied to the substrate W1 in the first step (S31). The higher concentration phosphoric acid aqueous solution has a higher etching rate with respect to the silicon nitride film than the lower concentration phosphoric acid aqueous solution. Therefore, the process time of the first step (S31) is reduced as compared with the case in which the lower concentration phosphoric acid aqueous solution is used.

According to the first embodiment, the mixing ratio between the phosphoric acid aqueous solution from the phosphoric acid line 19 and the water from the water supply line 20 can be adjusted by the opening degree control by means of the water flow rate adjusting valve 30. The concentration of the phosphoric acid aqueous solution to be spouted from the phosphoric acid nozzle 18 can be adjusted by the adjustment of the mixing ratio. Thus, the concentration of the phosphoric acid aqueous solution to be spouted from the phosphoric acid nozzle 18 can be changed with a simplified construction.

Next, a substrate treatment apparatus 101 according to a second embodiment of the present invention will be described. The substrate treatment apparatus 101 differs from the substrate treatment apparatus 1 of the first embodiment in that a phosphoric acid supplying device (phosphoric acid supplying unit) 106 is provided instead of the phosphoric acid supplying unit 6. FIG. 8 is a schematic diagram of the phosphoric acid supplying device 106 according to the second embodiment of the present invention. In the second embodiment, components corresponding to those in the first embodiment are designated by the same reference characters as in the first embodiment, and duplicate description will be omitted.

As shown in FIG. 8, the phosphoric acid supplying device 106 includes a phosphoric acid nozzle 103 which spouts a phosphoric acid aqueous solution toward a substrate W1 held by the spin chuck 5 (see FIG. 1), a first phosphoric acid supplying unit 110 which supplies a higher concentration phosphoric acid aqueous solution (e.g., having a concentration of about 86%) to the phosphoric acid nozzle 103, and a second phosphoric acid supplying unit 120 which supplies a lower concentration phosphoric acid aqueous solution (e.g., having a concentration of about 82%) to the phosphoric acid nozzle 103. The first phosphoric acid supplying unit 110 includes a first phosphoric acid tank 111 which stores the higher concentration phosphoric acid aqueous solution having a concentration adjusted to a higher concentration level (e.g., about 86%), and a first phosphoric acid line 107 which supplies the higher concentration phosphoric acid aqueous solution from the first phosphoric acid tank 111 to the phosphoric acid nozzle 103.

One of opposite ends of the first phosphoric acid line 107 is connected to the first phosphoric acid tank 111, and the other end of the first phosphoric acid line 107 is connected to the phosphoric acid nozzle 103. A first heater 112 which heats the phosphoric acid aqueous solution flowing through the first phosphoric acid line 107 to temperature-control the phosphoric acid aqueous solution, a first pump 113 which pumps up the phosphoric acid aqueous solution from the first phosphoric acid tank 111 into the first phosphoric acid line 107, a first filter 114 which filters the phosphoric acid aqueous solution flowing through the first phosphoric acid line 107 to remove foreign matter from the phosphoric acid aqueous solution, and a first phosphoric acid valve 117 which turns on and off the supply of the phosphoric acid aqueous solution from the first phosphoric acid line 107 to the phosphoric acid nozzle 103 are provided in this order along a flow direction in the first phosphoric acid line 107. After the startup of the substrate treatment apparatus 101 (treatment unit 2), the first pump 113 is constantly driven.

The first phosphoric acid line 107 is branched into a first return line 115 at a position between the first phosphoric acid valve 117 and the first filter 114 so that the phosphoric acid aqueous solution flowing through the first phosphoric acid line 107 can be returned into the first phosphoric acid tank 111. A first return valve 116 is provided in the first return line 115. The first phosphoric acid line 107 and the first return line 115 define a circulation passage through which the phosphoric acid aqueous solution is circulated from the first phosphoric acid tank 111.

The controller 3 closes the first phosphoric acid valve 117 and opens the first return valve 116 while driving the first pump 113. Thus, the phosphoric acid aqueous solution pumped up from the first phosphoric acid tank 111 flows through the first heater 112, the first filter 114, the first return valve 116 and the first return line 115 back into the first phosphoric acid tank 111. Thus, the phosphoric acid aqueous solution is circulated through the circulation passage from the first phosphoric acid tank 111. The phosphoric acid aqueous solution circulated through the circulation passage from the first phosphoric acid tank 111 is temperature-controlled to be maintained at a desired constant temperature (e.g., in a range of 80° C. to 215° C.) by the first heater 112.

Further, the first phosphoric acid tank 111 is replenished with water such as pure water in an amount equivalent to the amount of water evaporated from the first phosphoric acid tank 111. Thus, the concentration of the phosphoric acid aqueous solution retained in the first phosphoric acid tank 111 is adjusted to the higher concentration level (e.g., about 86%).

On the other hand, the controller 3 closes the first return valve 116 and opens the first phosphoric acid valve 117 while driving the first pump 113. Thus, the phosphoric acid aqueous solution pumped up from the first phosphoric acid tank 111 flows through the first heater 112, the first filter 114 and the first phosphoric acid valve 117 into the phosphoric acid nozzle 103.

The second phosphoric acid supplying unit 120 includes a second phosphoric acid tank 121 which stores the lower concentration phosphoric acid aqueous solution having a concentration adjusted to a lower concentration level (e.g., about 82%), and a second phosphoric acid line 108 which supplies the lower concentration phosphoric acid aqueous solution from the second phosphoric acid tank 121 to the phosphoric acid nozzle 103.

One of opposite ends of the second phosphoric acid line 108 is connected to the second phosphoric acid tank 121, and the other end of the second phosphoric acid line 108 is connected to the phosphoric acid nozzle 103. A second heater 122 which heats the phosphoric acid aqueous solution flowing through the second phosphoric acid line 108 to temperature-control the phosphoric acid aqueous solution, a second pump 123 which pumps up the phosphoric acid aqueous solution from the second phosphoric acid tank 121 into the second phosphoric acid line 108, a second filter 124 which filters the phosphoric acid aqueous solution flowing through the second phosphoric acid line 108 to remove foreign matter from the phosphoric acid aqueous solution, and a second phosphoric acid valve 127 which turns on and off the supply of the phosphoric acid aqueous solution from the second phosphoric acid line 108 to the phosphoric acid nozzle 103 are provided in this order along a flow direction in the second phosphoric acid line 108. After the startup of the substrate treatment apparatus 101 (treatment unit 2), the second pump 123 is constantly driven.

The second phosphoric acid line 108 is branched into a second return line 125 at a position between the second phosphoric acid valve 127 and the second filter 124 so that the phosphoric acid aqueous solution flowing through the second phosphoric acid line 108 can be returned into the second phosphoric acid tank 121. A second return valve 126 is provided in the second return line 125. The second phosphoric acid line 108 and the second return line 125 define a circulation passage through which the phosphoric acid aqueous solution is circulated from the second phosphoric acid tank 121.

The controller 3 closes the second phosphoric acid valve 127 and opens the second return valve 126 while driving the second pump 123. Thus, the phosphoric acid aqueous solution pumped up from the second phosphoric acid tank 121 flows through the second heater 122, the second filter 124, the second return valve 126 and the second return line 125 back into the second phosphoric acid tank 121. As a result, the phosphoric acid aqueous solution is circulated through the circulation passage from the second phosphoric acid tank 121. The phosphoric acid aqueous solution circulated through the circulation passage from the second phosphoric acid tank 121 is temperature-controlled to be maintained at a desired constant temperature (e.g., in a range of 80° C. to 215° C.) by the second heater 122.

On the other hand, the controller 3 closes the second return valve 126 and opens the second phosphoric acid valve 127 while driving the second pump 123. Thus, the phosphoric acid aqueous solution pumped up from the second phosphoric acid tank 121 flows through the second heater 122, the second filter 124 and the second phosphoric acid valve 127 into the phosphoric acid nozzle 103.

The phosphoric acid nozzle 103 is, for example, a so-called straight nozzle. The phosphoric acid nozzle 103 includes a generally hollow cylindrical casing (not shown). A tube wall of the casing of the phosphoric acid nozzle 103 has a first inlet port (not shown) connected to the other end of the first phosphoric acid line 107, and a second inlet port (not shown) connected to the other end of the second phosphoric acid line 108.

The controller 3 controls the opening/closing operations of the first and second phosphoric acid valves 117, 127 so as to switch a phosphoric acid aqueous solution supply source between the first phosphoric acid supplying unit 110 and the second phosphoric acid supplying unit 120 to supply the phosphoric acid aqueous solution from the supply source to the phosphoric acid nozzle 103.

More specifically, the controller 3 opens the first phosphoric acid valve 117 while closing the first return valve 116 and the second phosphoric acid valve 127. Thus, the phosphoric acid aqueous solution flows from the first phosphoric acid line 107 into the phosphoric acid nozzle 103. Thus, the higher concentration phosphoric acid aqueous solution can be spouted from the phosphoric acid nozzle 103.

On the other hand, the controller 3 opens the second phosphoric acid valve 127 while closing the first phosphoric acid valve 117 and the second return valve 126. Thus, the phosphoric acid aqueous solution from the second phosphoric acid line 108 flows into the phosphoric acid nozzle 103. Thus, the lower concentration phosphoric acid aqueous solution can be spouted from the phosphoric acid nozzle 103.

The substrate treatment apparatus 101 performs the exemplary treatment process shown in FIG. 3 in substantially the same manner. Hereinafter, duplicate description will be omitted, and only differences between the first embodiment and the second embodiment will be described.

As in the first embodiment, the phosphoric acid treatment step (Step S3 in FIG. 3) of supplying the phosphoric acid aqueous solution to the substrate W1 includes a first step (Step S31 in FIG. 3) of supplying the higher concentration phosphoric acid aqueous solution having a predetermined higher concentration (about 86%) to the substrate W1, a second step (S32 in FIG. 3) of supplying the higher concentration phosphoric acid aqueous solution having a predetermined higher concentration (about 86%) to the substrate W1 after the first step (S31), and a third step (S33 in FIG. 3) of supplying the lower concentration phosphoric acid aqueous solution having a predetermined lower concentration (about 82%) to the substrate W1 after the second step (S32).

At the beginning of the phosphoric acid treatment step (S3), the first step (S31) is performed. In the first step (S31), the controller 3 closes the second phosphoric acid valve 127, and opens the first phosphoric acid valve 117. Thus, the phosphoric acid aqueous solution having a concentration adjusted to the higher concentration level (about 86%) is supplied from the first phosphoric acid tank 111 into the phosphoric acid nozzle 103 through the first phosphoric acid line 107. Thus, the higher concentration phosphoric acid aqueous solution (concentration-adjusted to about 86%) is supplied to the phosphoric acid nozzle 103 to be spouted from the spout of the phosphoric acid nozzle 103.

After the first step (S31), the second step (S32) is started. Where the phosphoric acid aqueous solution to be spouted from the phosphoric acid nozzle 103 in the second step (S32) has the same concentration (about 86%) as in the first step (S31), the second phosphoric acid valve 127 is kept closed, and the first phosphoric acid valve 117 is kept open.

After the second step (S32), the third step (S33) is started. At the beginning of the third step (S33), the controller 3 closes the first phosphoric acid valve 117, and opens the second phosphoric acid valve 127. Thus, the phosphoric acid aqueous solution having a concentration adjusted to the lower concentration level (about 82%) is supplied from the second phosphoric acid tank 121 to the phosphoric acid nozzle 103 through the second phosphoric acid line 108. Thus, the lower concentration phosphoric acid aqueous solution (concentration-adjusted to about 82%) is supplied to the phosphoric acid nozzle 103 to be spouted from the spout of the phosphoric acid nozzle 103.

The second embodiment provides substantially the same effects as the first embodiment.

According to the second embodiment, the controller 3 controls the first and second phosphoric acid valves 117, 127 to switch the phosphoric acid aqueous solution supply source between the first phosphoric acid supplying unit 110 and the second phosphoric acid supplying unit 120 to supply the phosphoric acid aqueous solution from the supply source to the phosphoric acid nozzle 103. Thus, the concentration of the phosphoric acid aqueous solution to be spouted from the phosphoric acid nozzle 103 can be changed with a simplified construction.

A three-way valve may be provided between the phosphoric acid valve 117 and the first filter 114 in the first phosphoric acid line 107, which is branched into the first return line 115 via the three-way valve. The controller 3 may control the three-way valve so as to selectively feed out the phosphoric acid aqueous solution flowing through the first phosphoric acid line 107 into the phosphoric acid nozzle 103 or into the first return line 115. Further, a three-way valve may be provided between the phosphoric acid valve 127 and the second filter 124 in the second phosphoric acid line 108, which is branched into the second return line 125 via the three-way valve. The controller 3 may control the three-way valve so as to selectively feed out the phosphoric acid aqueous solution flowing through the second phosphoric acid line 108 into the phosphoric acid nozzle 103 or into the second return line 125.

Figure 9:
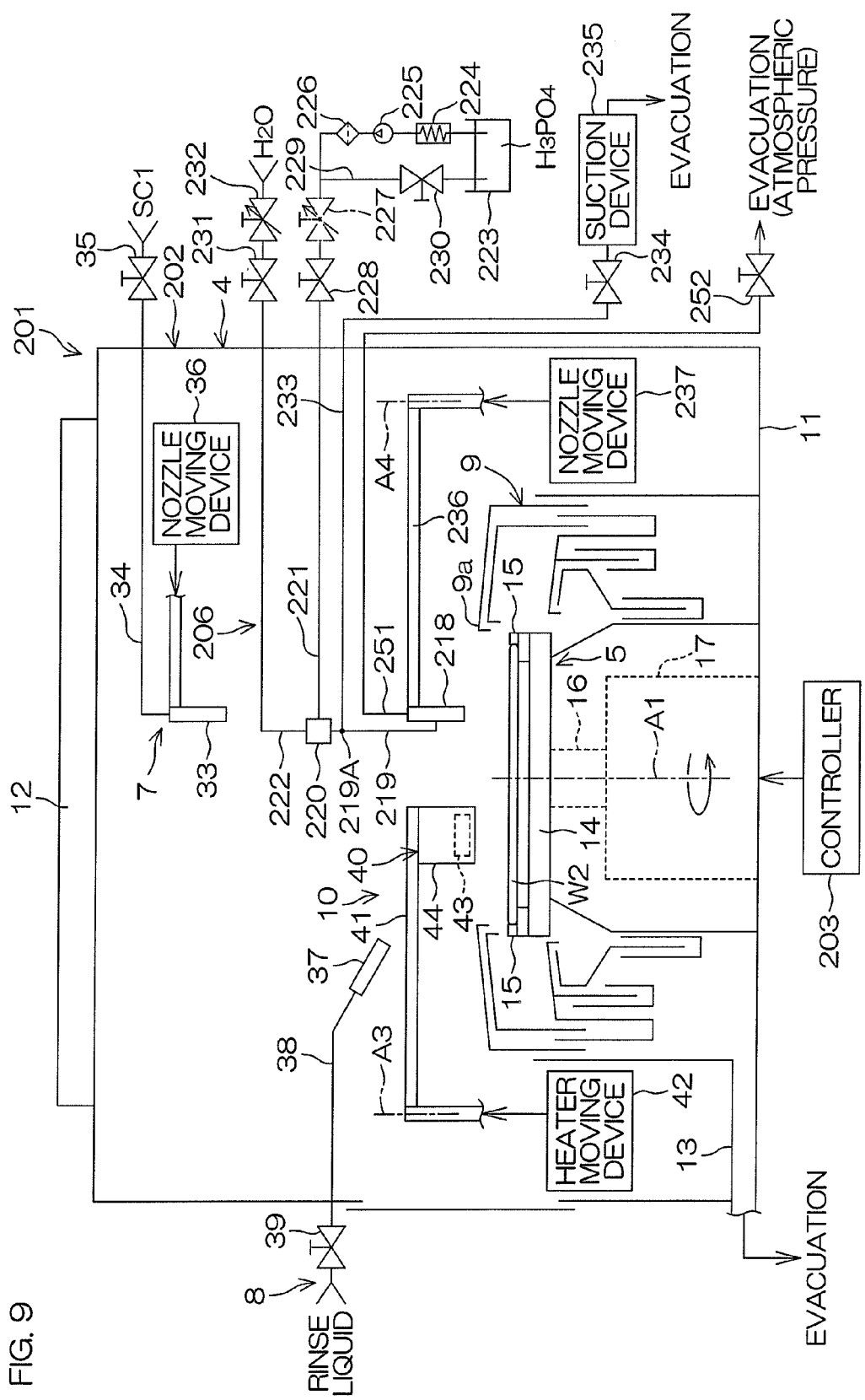
FIG. 9 is a schematic diagram showing the inside of a treatment unit of a substrate treatment apparatus according to a third embodiment of the present invention as seen horizontally.

FIG. 9 is a schematic diagram showing the inside of a treatment unit 202 of a substrate treatment apparatus 201 according to a third embodiment of the present invention as seen horizontally.

The substrate treatment apparatus 201 is of a single substrate treatment type adapted to treat a single disk-shaped substrate W2 (e.g., semiconductor wafer) at a time. The substrate treatment apparatus 201 includes a plurality of treatment units 202 (only one of which is shown in FIG. 9) each adapted to treat the substrate W2 with a treatment fluid such as a treatment liquid or a treatment gas, and a controller (retention space switching unit) 203 which controls the operations of devices provided in the substrate treatment apparatus 201 and the opening/closing operations of valves. A single treatment unit 202 may be provided in the substrate treatment apparatus 201.

In the third embodiment, components corresponding to those in the first embodiment are designated by the same reference characters as in FIGS. 1 to 7C, and duplicate description will be omitted. The treatment unit 202 of the third embodiment differs from the treatment unit 2 of the first embodiment in that a phosphoric acid supplying device 206 is provided instead of the phosphoric acid supplying device 6. That is, as shown in FIG. 9, the treatment unit 202 includes a box-shaped chamber 4 having an inside space, a spin chuck 5 which horizontally holds the substrate W2 in the chamber 4 and rotates the substrate W2 about a rotation axis A1 vertically extending through a center of the substrate W2, a treatment liquid supplying device (a phosphoric acid supplying device 206, an SC1 supplying device 7 and a rinse liquid supplying device 8) which supplies a chemical liquid (phosphoric acid aqueous solution and SC1) and a rinse liquid to the substrate W2, a tubular cup 9 surrounding the spin chuck 5, and a heating device 10 which heats the substrate W2.

As shown in FIG. 9, the phosphoric acid supplying device 206 includes a phosphoric acid nozzle (nozzle) 218 which spouts the phosphoric acid aqueous solution toward the substrate W2 held by the spin chuck 5, a mixing portion 220 which mixes the phosphoric acid aqueous solution with water, a phosphoric acid tank 223 which stores the phosphoric acid aqueous solution, a phosphoric acid line 221 which supplies the phosphoric acid aqueous solution from the phosphoric acid tank 223 to the mixing portion 220, a water line 222 which supplies the water to the mixing portion 220, a liquid mixture line 219 connected between the mixing portion 220 and the phosphoric acid nozzle 218, and a gas outlet line 251 which expels water vapor from the inside of the phosphoric acid nozzle 218.

One of opposite ends of the phosphoric acid line 221 is connected to the phosphoric acid tank 223, and the other end of the phosphoric acid line 221 is connected to the mixing portion 220. A heater 224 which heats the phosphoric acid aqueous solution flowing through the phosphoric acid line 221 to temperature-control the phosphoric acid aqueous solution, a pump 225 which pumps up the phosphoric acid aqueous solution from the phosphoric acid tank 223 to feed the phosphoric acid aqueous solution to the phosphoric acid line 221, a filter 226 which filters the phosphoric acid aqueous solution flowing through the phosphoric acid line 221 to remove foreign matter from the phosphoric acid aqueous solution, and a phosphoric acid valve 228 which turns on and off the supply of the phosphoric acid aqueous solution to the mixing portion 220 from the phosphoric acid line 221 are provided in this order from the phosphoric acid tank 223 in the phosphoric acid line 221. The concentration of the phosphoric acid aqueous solution stored in the phosphoric acid tank 223 is, for example, in a range of 50% to 100%, preferably about 80%. After the startup of the treatment unit 202, the pump 225 is constantly driven.

The phosphoric acid line 221 is branched into a return line 229 at a position between the phosphoric acid valve 228 and the filter 226 so that the phosphoric acid aqueous solution flowing through the phosphoric acid line 221 can be returned into the phosphoric acid tank 223. A return valve 230 is provided in the return line 229. The phosphoric acid line 221 and the return line 229 define a circulation passage through which the phosphoric acid aqueous solution is circulated from the phosphoric acid tank 223.

The controller 203 closes the phosphoric acid valve 228 and opens the return valve 230 while driving the pump 225. Thus, the phosphoric acid aqueous solution pumped up from the phosphoric acid tank 223 flows through the heater 224, the filter 226, the return valve 230 and the return line 229 back into the phosphoric acid tank 223, whereby the phosphoric acid aqueous solution is circulated through the circulation passage from the phosphoric acid tank 223. The phosphoric acid aqueous solution thus circulated through the circulation passage from the phosphoric acid tank 223 is temperature-controlled by the heater 224 to be maintained at a desired constant temperature (e.g., in a range of 80° C. to 215° C.).

On the other hand, the controller 203 closes the return valve 230 and opens the phosphoric acid valve 228 while driving the pump 225. Thus, the phosphoric acid aqueous solution pumped up from the phosphoric acid tank 223 flows through the heater 224, the filter 226 and the phosphoric acid valve 228 into the phosphoric acid nozzle 218.

A three-way valve may be provided between the phosphoric acid valve 228 and the filter 226 in the phosphoric acid line 221, which is branched into the return line 229 via the three-way valve. In this case, the phosphoric acid aqueous solution flowing through the phosphoric acid line 221 may be selectively fed out into the phosphoric acid nozzle 218 or into the return line 229 by controlling the three-way valve.

Water is supplied from a water supply source to one of opposite ends of the water line 222. The other end of the water line 222 is connected to the mixing portion 220. A water valve 231 for opening and closing the water line 222, and a water flow rate adjusting valve 232 for changing the opening degree of the water line 222 are provided in this order from the mixing portion 220 in the water line 222. The water to be supplied to the water line 222 is, for example, pure water (deionized water) not by way of limitation. Other examples of the water include carbonated water, electrolytic ion water, hydrogen water, ozone water, and a hydrochloric acid aqueous solution having a dilute concentration (e.g., about 10 to about 100 ppm).

When the controller 203 opens the water valve 231, the water is supplied to the mixing portion 220 from the water line 222. The flow rate of the water to be supplied to the mixing portion 220 is adjusted by the opening degree control by means of the water flow rate adjusting valve 232.

The controller 203 closes the return valve 230, and opens the phosphoric acid valve 228 and the water valve 231. Thus, the phosphoric acid aqueous solution from the phosphoric acid line 221 and the water from the water line 222 flow into the mixing portion 220. A liquid mixture of the phosphoric acid aqueous solution and the water flowing into the mixing portion 220 flows through the liquid mixture line 219 to be supplied into the phosphoric acid nozzle 218. The flow rate of the water flowing into the mixing portion 220 is adjusted by the opening degree control by means of the water flow rate adjusting valve 232, whereby the mixing ratio between the phosphoric acid aqueous solution and the water is changed. By thus adjusting the mixing ratio, the concentration of the phosphoric acid aqueous solution to be spouted from the phosphoric acid nozzle 218 is adjusted to a predetermined concentration level.

A phosphoric acid flow rate adjusting valve 227 (indicated by a two-dot-and-dash line in FIG. 9) for changing the opening degree of the phosphoric acid line 221 may be provided in the phosphoric acid line 221. In this case, the flow rate of the phosphoric acid aqueous solution flowing into the mixing portion 220 is adjusted by the opening degree control by means of the phosphoric acid flow rate adjusting valve 227, whereby the mixing ratio between the phosphoric acid aqueous solution and the water in the mixing portion 220 is adjusted. Further, the mixing ratio between the phosphoric acid aqueous solution and the water in the mixing portion 220 may be adjusted by the opening degree control by means of the water flow rate adjusting valve 232 as well as by the opening degree control by means of the phosphoric acid flow rate adjusting valve 227.

The liquid mixture line 219 is branched at a predetermined branch position 219A to be connected to one of opposite ends of a suction line 233 for sucking water vapor (gas) from the inside of the liquid mixture line 219. The other end of the suction line 233 is connected to a suction device 235. A suction valve 234 is provided in the suction line 233. The suction device 235 is constantly driven. When the suction valve 234 is opened, therefore, the suction line 233 is evacuated, and the gas (water vapor) is sucked from the inside of the phosphoric acid nozzle 218 through the suction line 233 by the suction device 235. The suction valve 234 is controlled to be opened by the controller 203.

The gas outlet line 251 is a line through which the gas (water vapor) generated in the phosphoric acid nozzle 218 is expelled outside the phosphoric acid nozzle 218. One of opposite ends of the gas outlet line 251 is connected to the phosphoric acid nozzle 218, and the other end of the gas outlet line 251 is open to the atmospheric pressure. A gas outlet valve 252 for opening and closing the gas outlet line 251 is provided in the gas outlet line 251. In an exemplary treatment process according to the third embodiment, the gas outlet valve 252 is controlled to be generally open by the controller 203.

As shown in FIG. 9, the phosphoric acid supplying device 206 further includes a nozzle arm 236 having a distal end to which the phosphoric acid nozzle 218 is attached, and a phosphoric acid nozzle moving device 237 which pivots the nozzle arm 236 about a pivot axis A4 extending vertically on a lateral side of the spin chuck 5 and vertically moves up and down the nozzle arm 236 along the pivot axis A4 to horizontally and vertically move the phosphoric acid nozzle 218. The phosphoric acid nozzle moving device 237 horizontally moves the phosphoric acid nozzle 218 between a treatment position at which the phosphoric acid nozzle 218 is located to spout the phosphoric acid aqueous solution to an upper surface of the substrate W2 and a retracted position to which the phosphoric acid nozzle 218 is retracted on a lateral side of the substrate W2 as seen in plan.

Figure 10:
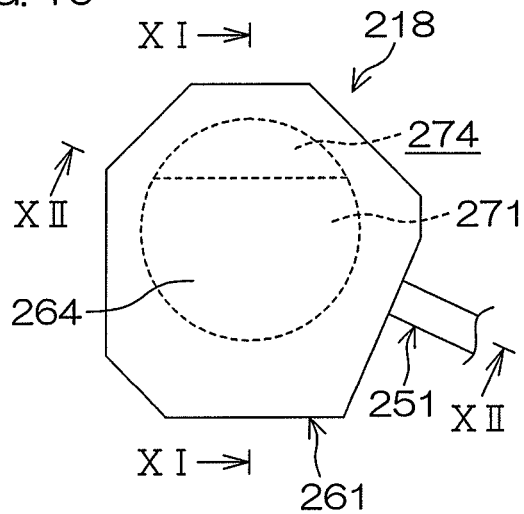
FIG. 10 is a plan view of a phosphoric acid nozzle shown in FIG. 9.
Figure 11:
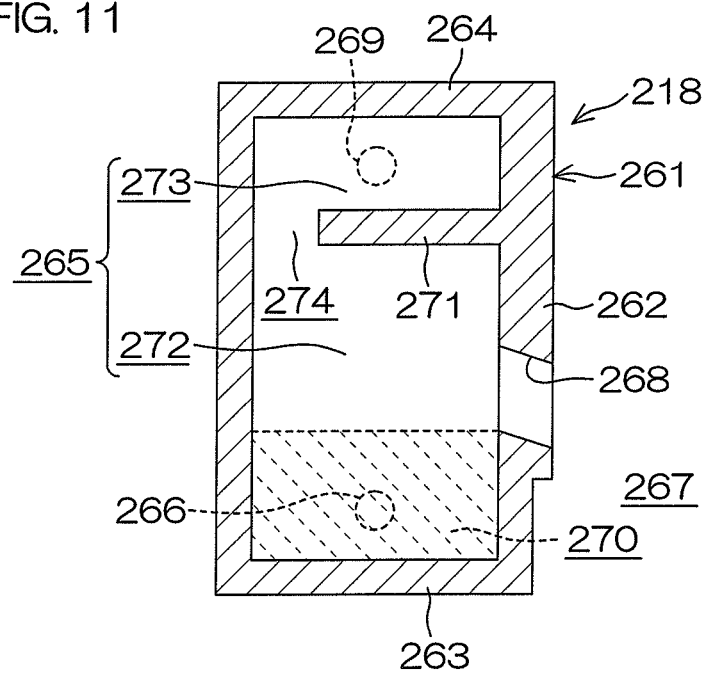
FIG. 11 is a diagram taken along a sectional plane XI-XI in FIG. 10.
Figure 12:
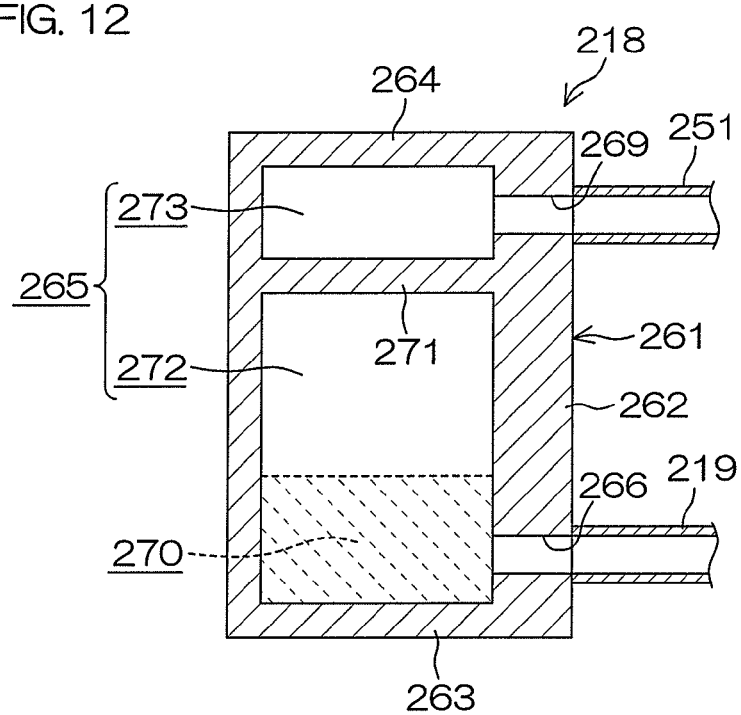
FIG. 12 is a diagram taken along a sectional plane XII-XII in FIG. 10.
Figure 13:
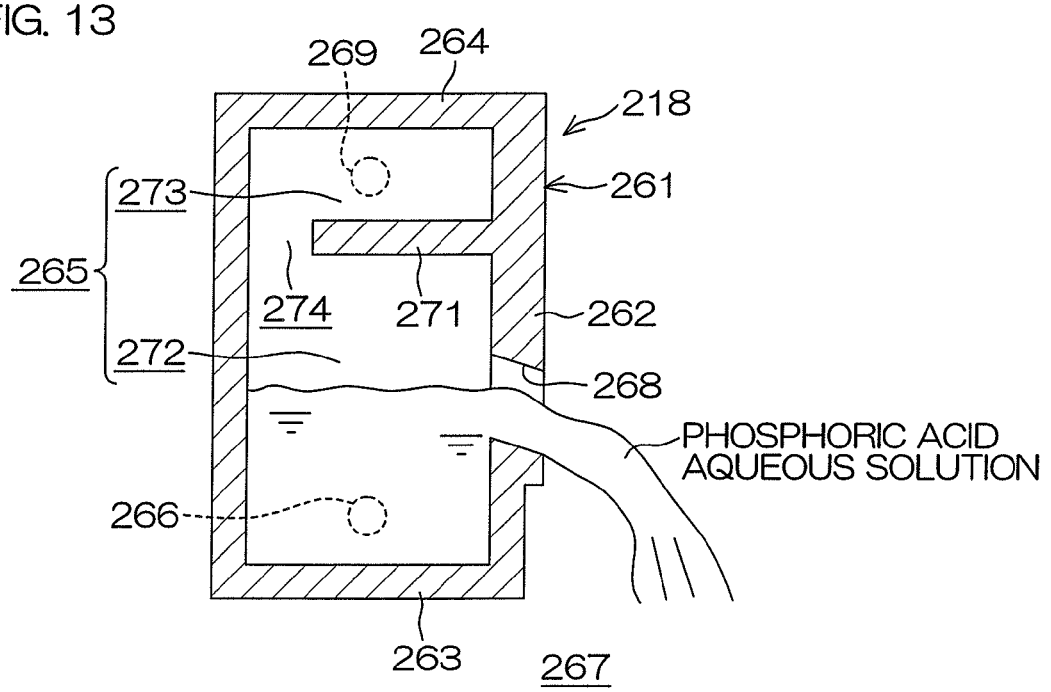
FIG. 13 is a sectional view of the phosphoric acid nozzle with a liquid mixture of a phosphoric acid aqueous solution and water fed therein.

FIG. 10 is a plan view of the phosphoric acid nozzle 218. FIG. 11 is a diagram taken along a sectional plane XI-XI in FIG. 10. FIG. 12 is a diagram taken along a sectional plane XII-XII in FIG. 10. FIG. 13 is a sectional view of the phosphoric acid nozzle 218 with the phosphoric acid aqueous solution/water mixture fed therein.

Referring to FIGS. 10 to 13, the phosphoric acid nozzle 218 will be described.

The phosphoric acid nozzle 218 is, for example, a so-called straight nozzle, and includes a generally hollow cylindrical casing 261. The casing 261 includes a generally hollow cylindrical side wall portion 262, a bottom wall portion 263 entirely covering a lower end of the side wall portion 262 and a top wall portion 264 entirely covering an upper end of the side wall portion 262, and a generally cylindrical inner space 265 is defined in the casing 261. The phosphoric acid nozzle 218 is attached to the distal end of the nozzle arm 236 (see FIG. 9) with the center axis of the casing 261 thereof extending vertically. That is, the side wall portion 262 extends vertically, while the top wall portion 264 and the bottom wall portion 263 extend horizontally.

The side wall portion 262 of the casing 261 has a single liquid mixture inlet port 266 to which the liquid mixture obtained by mixing the phosphoric acid aqueous solution and the water in the mixing portion 220 is fed, a single spout (liquid outlet port) 268 through which the liquid mixture obtained by mixing the phosphoric acid aqueous solution and the water in the inner space 265 is spouted toward an outer space 267, and a single gas outlet port 269 through which the water vapor generated in the inner space 265 due to the mixing of the phosphoric acid aqueous solution and the water is fed out.

The liquid mixture inlet port 266 is located in a lower portion of the side wall portion 262. The liquid mixture inlet port 266 is a through-hole extending thicknesswise through the side wall portion 262. One of opposite ends of the liquid mixture line 219 is connected to the liquid mixture inlet port 266.

The spout 268 is located at a higher position than the liquid mixture inlet port 266 in the side wall portion 262 to be circumferentially offset about 90 degrees from the liquid mixture inlet port 266. The spout 268 is a through-hole extending from an inner surface to an outer surface of the side wall portion 262. The spout 268 has a greater diameter than the liquid mixture inlet port 266, and extends obliquely downward outward through the side wall portion 262.

The gas outlet port 269 is located at a higher position than the spout 268 at the same circumferential position as the liquid mixture inlet port 266 in the side wall portion 262. The gas outlet port 269 is a through-hole extending thicknesswise through the side wall portion 262. The one end of the gas outlet line 251 is connected to the gas outlet port 269.

A part of the inner space 265 of the casing 261 below the spout 268 serves as a retention space 270 (hatched with broken lines in FIGS. 11 and 12) in which the phosphoric acid aqueous solution/water mixture fed into the inner space 265 can be retained. The retention space 270 is a cylindrical space. The retention space 270 is capable of retaining the phosphoric acid aqueous solution/water mixture fed into the inner space 265 up to the height of the spout 268 which is an upper limit liquid level. The volume of the retention space 270 is, for example, 2 cm$^3$. The volume of the retention space 270 is such that, where the phosphoric acid aqueous solution/water mixture is continuously supplied into the phosphoric acid nozzle 218 at a flow rate of about 16 cm$^3$/sec, the phosphoric acid aqueous solution/water mixture flowing through the retention space 270 is retained (temporarily stored) in the retention space 270 for a period of not less than 0.1 second (e.g., about 0.125 seconds).

The casing 261 has a plate-shaped partition wall 271 horizontally extending from the side wall portion 262. The partition wall 271 is disposed at a lower position than the gas outlet port 269 above the retention space 270 in the inner space 265. The partition wall 271 is a D-shaped plate (having a generally semicircular plate shape), and its arcuate peripheral surface is connected to the inner peripheral surface of the side wall portion 262. The partition wall 271 serves as an outflow preventing plate for substantially preventing the phosphoric acid aqueous solution/water mixture retained in a lower space 272 (retention space 270) from flowing out into the gas outlet line 251 through the gas outlet port 269. The partition wall 271 partitions the inner space 265 into the lower space 272 and an upper space 273.

The lower space 272 has a cylindrical shape, and includes the entire retention space 270. The lower space 272 has the liquid mixture inlet port 266.

The upper space 273 has a cylindrical shape, and has the gas outlet port 269.

A crescent-shaped opening 274 (having a generally semicircular shape) is defined between the lower space 272 and the upper space 273 by the D-shaped partition wall 271. The upper space 273 and the lower space 272 communicate with each other via the opening 274.

The phosphoric acid aqueous solution/water mixture flowing through the liquid mixture line 219 is supplied to the inner space 265 (more specifically, the lower space 272) through the liquid mixture inlet port 266. The phosphoric acid aqueous solution/water mixture supplied into the lower space 272 is retained in the retention space 270. While the phosphoric acid aqueous solution/water mixture is continuously supplied into the lower space 272, the phosphoric acid aqueous solution/water mixture overflows from the retention space 270 as shown in FIG. 13. The overflowing phosphoric acid aqueous solution/water mixture is spouted from the spout 268 toward the outer space 267.

Figure 14:
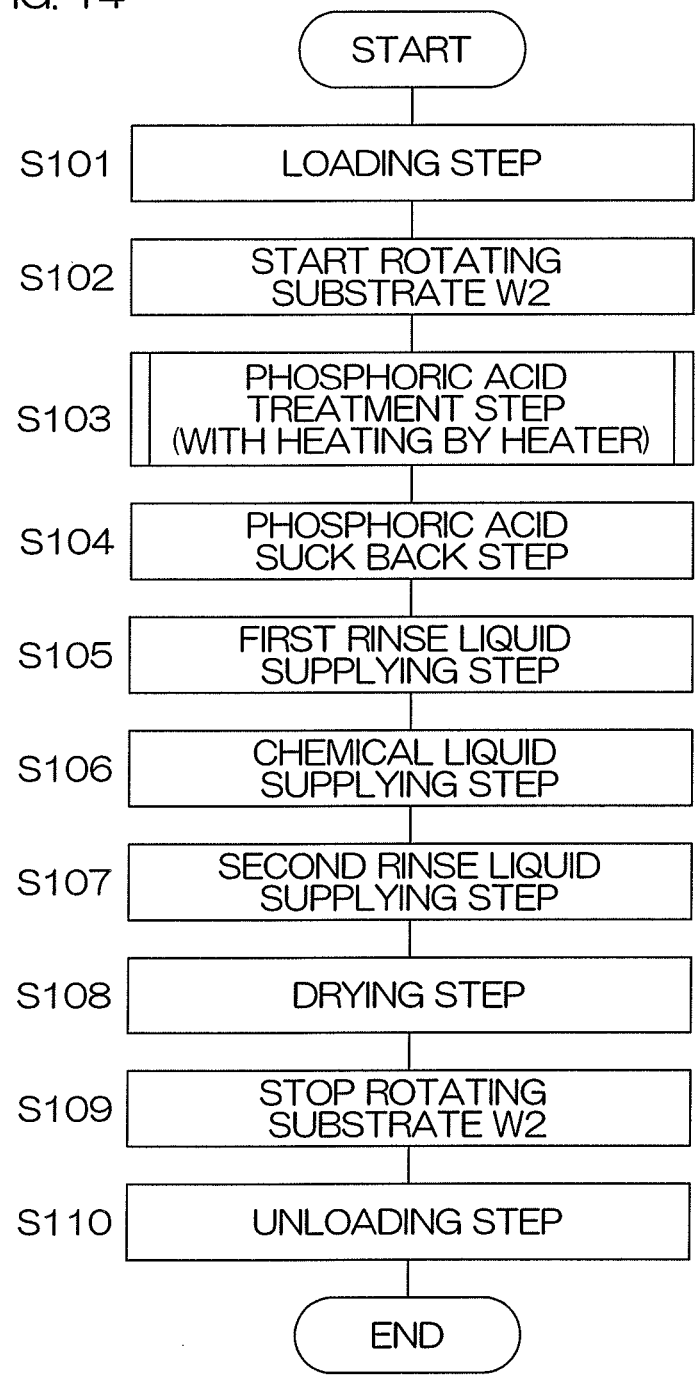
FIG. 14 is a flow chart for explaining an exemplary treatment process to be performed by the treatment unit.

FIG. 14 is a flow chart for explaining an exemplary treatment process to be performed by the treatment unit 202. A selective etching process will hereinafter be described in which a phosphoric acid aqueous solution is supplied to a front surface of a substrate W2 (silicon wafer) including a thin silicon nitride film and a thin silicon oxide film formed in a surface layer thereof to selectively etch the thin silicon nitride film.

Hereinafter, reference is made to FIG. 9 and, as required, also to FIGS. 10 to 14.

When the substrate W2 is to be treated by the treatment unit 202, a substrate loading step (Step S101 in FIG. 14) is performed to load the substrate W2 into the chamber 4. More specifically, the controller 203 causes a transport robot (not shown) to hold the substrate W2 on its hands and move the hands into the chamber 4 with all the nozzles being retracted from above the spin chuck 5. Then, the controller 203 causes the transport robot to place the substrate W2 onto the spin chuck 5. Thereafter, the controller 203 causes the spin chuck 5 to hold the substrate W2. In turn, the controller 203 causes the spin chuck 5 to start rotating the substrate W2 (Step S102 in FIG. 14). The rotation speed of the substrate W2 is increased to a predetermined phosphoric acid treatment rotation speed (e.g., 30 to 300 rpm, more specifically about 100 rpm), and maintained at the phosphoric acid treatment rotation speed. After the substrate W2 is placed on the spin chuck 5, the controller 203 retracts the hands of the transport robot from the chamber 4. In the substrate loading step, the gas outlet valve 252 is open, and the suction valve 234 is closed.

Subsequently, a phosphoric acid treatment step (Step S103 in FIG. 14) is performed to supply the phosphoric acid aqueous solution to the substrate W2. More specifically, the controller 203 controls the phosphoric acid nozzle moving device 237 to move the phosphoric acid nozzle 218 from the retracted position to above the substrate W2. Thus, the phosphoric acid nozzle 218 is located at the treatment position (on the rotation axis A1 of the substrate W2 above the substrate W2). After the phosphoric acid nozzle 218 is located at the treatment position, the controller 203 closes the return valve 230 and opens the phosphoric acid valve 228 and the water valve 231. Thus, the phosphoric acid aqueous solution from the phosphoric acid line 221 and the water from the water line 222 flow into the mixing portion 220. A liquid mixture of the phosphoric acid aqueous solution and the water flowing into the mixing portion 220 flows through the liquid mixture line 219 to be supplied into the inner space 265 of the phosphoric acid nozzle 218 (more specifically, into the lower space 272) from the liquid mixture inlet port 266 of the phosphoric acid nozzle 218. The phosphoric acid aqueous solution and the water vigorously react with each other in the mixing portion 220, so that the phosphoric acid aqueous solution/water mixture is supplied into the lower space 272 in a bumping state. That is, water vapor is generated due to the mixing of the phosphoric acid aqueous solution and the water. Therefore, the phosphoric acid aqueous solution/water mixture flows through the retention space 270 in a state such that the mixture is mingled with the water vapor (in a water vapor containing state). At this time, the phosphoric acid aqueous solution/water mixture is retained in the retention space 270 for a predetermined period (not shorter than 0.1 second).

The water vapor contained in the phosphoric acid aqueous solution/water mixture is guided from the lower space 272 into the upper space 273. Due to the generation of the water vapor, the inner space 265 is maintained at a positive pressure. The gas outlet valve 252 is constantly open during the process sequence, so that the generated water vapor is guided into the gas outlet line 251 through the gas outlet port 269 to be expelled from the other end of the gas outlet line 251.

The phosphoric acid aqueous solution spouted from the phosphoric acid nozzle 218 is applied to a center portion of an upper surface of the rotating substrate W2, and then flows radially outward on the upper surface of the substrate W2 by a centrifugal force. Therefore, the phosphoric acid aqueous solution is supplied over the entire upper surface of the substrate W2, which is thereby covered with a liquid film of the phosphoric acid aqueous solution. Thus, the upper surface of the substrate W2 is etched with the phosphoric acid aqueous solution.

Further, the phosphoric acid aqueous solution scatters around the substrate W2 and is received by the cup 9 to be guided to the recovery device via the cup 9. Then, the phosphoric acid aqueous solution guided to the recovery device is supplied again to the substrate W2. This reduces the use amount of the phosphoric acid aqueous solution.

After a lapse of a predetermined phosphoric acid spouting period, the controller 203 closes the phosphoric acid valve 228 and the water valve 231.

In the phosphoric acid treatment step (S103), a heating step is also performed to heat the phosphoric acid aqueous solution on the substrate W1. More specifically, the controller 203 causes the infrared heater 40 to start emitting light. Thereafter, the controller 203 controls the heater moving device 42 to horizontally move the infrared heater 40 from the retracted position to above the substrate W2, and keep the infrared heater 40 still at the treatment position on the rotation axis A1. With the infrared heater 40 located at the treatment position, the controller 203 may keep the infrared heater 40 still with a substrate opposing surface of the infrared heater 40 in contact with the liquid film of the phosphoric acid aqueous solution retained on the substrate W2, or may keep the infrared heater 40 still with a lower surface of the infrared heater 40 spaced a predetermined distance from the liquid film of the phosphoric acid aqueous solution on the substrate W2.

The heating temperature of the substrate W2 to be heated by the infrared heater 40 is set not lower than the boiling point of the phosphoric acid aqueous solution of the specific concentration present on the substrate W2 (e.g., a predetermined temperature in a range of 150° C. to 190° C.). Therefore, the phosphoric acid aqueous solution of the specific concentration present on the substrate W2 is heated up to its boiling point, and maintained in a boiling state. Particularly, where the heating temperature of the substrate W2 to be heated by the infrared heater 40 is set higher than the boiling point of the phosphoric acid aqueous solution of the specific concentration, a temperature at an interface between the substrate W2 and the phosphoric acid aqueous solution is maintained at a temperature higher than the boiling point, thereby promoting the etching of the substrate W2.

In the heating step, the infrared heater 40 located above the substrate W2 may be moved along the upper surface of the substrate W2 between a center portion of the substrate W2 and the middle of a peripheral portion of the substrate W2.

The phosphoric acid treatment step (S103) may be performed while suppressing the outflow of the phosphoric acid aqueous solution from the upper surface of the substrate W2 to retain the liquid film of the phosphoric acid aqueous solution on the upper surface of the substrate W2 (in a puddle state). In this case, the supply of the phosphoric acid aqueous solution onto the substrate W2 may be once stopped after the formation of the liquid film of the phosphoric acid aqueous solution on the substrate W2.

After the spouting of the phosphoric acid aqueous solution from the phosphoric acid nozzle 218 is stopped, the phosphoric acid aqueous solution/water mixture present in the liquid mixture line 219 is sucked (Step S104 (phosphoric acid suck back step) in FIG. 14).

More specifically, the controller 203 opens the suction valve 234 with the phosphoric acid valve 228 and the water valve 231 kept closed. Thus, the suction device 235 can perform its function, whereby the phosphoric acid aqueous solution/water mixture present in the liquid mixture line 219 is sucked via the suction line 233 by the suction device 235. By the suction from the inside of the liquid mixture line 219 by the suction device 235, the phosphoric acid aqueous solution/water mixture is partly expelled from the liquid mixture line 219 and, therefore, a leading liquid surface of the phosphoric acid aqueous solution/water mixture is retracted from the distal end of the liquid mixture line 219. After the leading liquid surface of the phosphoric acid aqueous solution/water mixture is retracted to a predetermined position, the controller 203 closes the suction valve 234 to thereby stop the suction from the inside of the liquid mixture line 219. Thus, the phosphoric acid aqueous solution/water mixture is prevented from entering the phosphoric acid nozzle 218 after the spouting of the phosphoric acid aqueous solution from the phosphoric acid nozzle 218 is stopped. This reliably prevents the phosphoric acid aqueous solution from inadvertently dripping from the phosphoric acid nozzle 218.

If the phosphoric acid aqueous solution is dripped onto the substrate W2 after the phosphoric acid treatment step (S103), the phosphoric acid aqueous solution on the substrate W2 receives a centrifugal force generated by the higher speed rotation of the substrate W2 in the drying step (Step S108 in FIG. 14 to be described later) to be radially moved on the upper surface of the substrate W2. This results in a multiplicity of particles radially scattered on the upper surface (front surface) of the substrate W2. In the present invention, however, there is no such possibility, because the dripping of the phosphoric acid aqueous solution from the phosphoric acid nozzle 218 is prevented after the spouting of the phosphoric acid aqueous solution is stopped.

After the phosphoric acid suck back step (S104), the controller 203 controls the phosphoric acid nozzle moving device 237 to move the phosphoric acid nozzle 218 from the treatment position above the substrate W2 to the retracted position.

Then, a first rinse liquid supplying step (Step S105 in FIG. 14) is performed to supply the rinse liquid to the substrate W2. More specifically, the controller 203 opens the rinse liquid valve 39 to spout the rinse liquid toward the upper surface center portion of the substrate W2 from the rinse liquid nozzle 37 while rotating the substrate W2. Thus, a liquid film of the rinse liquid is formed as covering the entire upper surface of the substrate W2, whereby the phosphoric acid aqueous solution remaining on the upper surface of the substrate W2 is rinsed away with the rinse liquid. After a lapse of a predetermined period from the opening of the rinse liquid valve 39, the controller 203 closes the rinse liquid valve 39 to stop spouting the rinse liquid.

Then, a chemical liquid supplying step (Step S106 in FIG. 14) is performed to supply the SC1 (exemplary chemical liquid) to the substrate W2. More specifically, the controller 203 controls the SC1 nozzle moving device 36 to move the SC1 nozzle 33 from the retracted position to the treatment position. After the SC1 nozzle 33 is located above the substrate W2, the controller 203 opens the SC1 valve 35 to spout the SC1 from the SC1 nozzle 33 toward the upper surface of the rotating substrate W2. In this state, the controller 203 controls the SC1 nozzle moving device 36 to reciprocally move an SC1 applying position on the upper surface of the substrate W2 between the center portion and the peripheral portion of the substrate W2. After a lapse of a predetermined period from the opening of the SC1 valve 35, the controller 203 closes the SC1 valve 35 to stop spouting the SC1. Thereafter, the controller 203 controls the SC1 nozzle moving device 36 to retract the SC1 nozzle 33 from above the substrate W2.

The SC1 spouted from the SC1 nozzle 33 is applied on the upper surface of the substrate W2, and then flows outward on the upper surface of the substrate W2 by a centrifugal force. Therefore, the rinse liquid on the substrate W2 is forced outward by the SC1 to be expelled around the substrate W2. Thus, the rinse liquid film on the substrate W2 is replaced with a liquid film of the SC1 covering the entire front surface of the substrate W2. Further, the controller 203 moves the SC1 applying position on the upper surface of the substrate W2 between the center portion to the peripheral portion of the substrate W2 while rotating the substrate W2. Therefore, the SC1 applying position is moved over the entire upper surface of the substrate W2. Thus, the entire upper surface of the substrate W2 is scanned. Therefore, the SC1 spouted from the SC1 nozzle 33 is directly sprayed over the entire upper surface of the substrate W2, whereby the entire upper surface of the substrate W2 is uniformly treated.

Subsequently, a second rinse liquid supplying step (Step S107 in FIG. 14) is performed to supply the rinse liquid to the substrate W2. More specifically, the controller 203 opens the rinse liquid valve 39 to spout the rinse liquid from the rinse liquid nozzle 37 toward the upper surface center portion of the substrate W2 while rotating the substrate W2. Thus, the SC1 present on the substrate W2 is forced outward by the rinse liquid to be expelled around the substrate W2. Therefore, the SC1 liquid film present on the substrate W2 is replaced with a liquid film of the rinse liquid covering the entire upper surface of the substrate W2. After a lapse of a predetermined period from the opening of the rinse liquid valve 39, the controller 203 closes the rinse liquid valve 39 to stop spouting the rinse liquid.

Then, a drying step (Step S108 in FIG. 14) is performed to dry the substrate W2. More specifically, the controller 203 controls the spin chuck 5 to accelerate the rotation of the substrate W2 to rotate the substrate W2 at a rotation speed (e.g., 500 to 3000 rpm) higher than the rotation speed employed in the second rinse liquid supplying step and the preceding steps. Thus, a greater centrifugal force is applied to the liquid present on the substrate W2, so that the liquid adhering to the substrate W2 is spun out around the substrate W2. In this manner, the liquid is removed from the substrate W2, whereby the substrate W2 is dried. After a lapse of a predetermined period from the start of the higher speed rotation of the substrate W2, the controller 203 controls the spin chuck 5 to stop the rotation of the substrate W2 (Step S109 in FIG. 14).

Subsequently, an unloading step (Step S110 in FIG. 14) is performed to unload the substrate W2 from the chamber 4. More specifically, the controller 203 controls the spin chuck 5 to release the substrate W2. Thereafter, the controller 203 controls the transport robot (not shown) to move the hands into the chamber 4 with all the nozzles being retracted from above the spin chuck 5. Then, the controller 203 causes the hands of the transport robot to hold the substrate W2 present on the spin chuck 5. Thereafter, the controller 203 retracts the hands of the transport robot from the chamber 4. Thus, the treated substrate W2 is unloaded from the chamber 4.

In the phosphoric acid treatment step (S103), as described above, the phosphoric acid aqueous solution/water mixture is supplied into the phosphoric acid nozzle 218. Since water is evaporated from the phosphoric acid aqueous solution/water mixture supplied at a temperature not lower than 100° C. onto the substrate W2, the mixing ratio of the water to be supplied to the phosphoric acid nozzle 218 is set at a relatively high level in consideration of the amount of the water to be evaporated in the phosphoric acid treatment step (S103).

In this case, the phosphoric acid aqueous solution/water mixture experiences a bumping phenomenon when the phosphoric acid aqueous solution and the water are mixed together, and flows through the phosphoric acid nozzle 218 in a water vapor containing state. Without the provision of the retention space 270 in the inner space 265 of the phosphoric acid nozzle 218, the phosphoric acid aqueous solution/water mixture is unstably spouted from the phosphoric acid nozzle 218 because the phosphoric acid aqueous solution/water mixture contains water vapor. Therefore, the phosphoric acid aqueous solution/water mixture is liable to be momentarily vigorously spouted from the phosphoric acid nozzle 218 or to be spouted in a spray form but not in a liquid droplet form. In this case, the upper surface of the substrate W2 is liable to be damaged. In addition, the etching power of the phosphoric acid aqueous solution supplied to the upper surface of the substrate W2 is liable to be reduced because the phosphoric acid aqueous solution spouted in the spray form is quickly cooled.

According to the third embodiment, the retention space 270 is provided in the inner space 265 of the phosphoric acid nozzle 218. The phosphoric acid aqueous solution/water mixture supplied into the inner space 265 of the phosphoric acid nozzle 218 experiences the bumping phenomenon, and contains water vapor. The phosphoric acid aqueous solution/water mixture flows through the retention space 270 toward the spout 268 while experiencing the bumping phenomenon. The gas outlet line 251 is connected to the phosphoric acid nozzle 218, so that the water vapor contained in the phosphoric acid aqueous solution/water mixture is expelled outside the phosphoric acid nozzle 218 through the gas outlet line 251.

Since the phosphoric acid aqueous solution/water mixture is retained in the retention space 270, the retention period during which the phosphoric acid aqueous solution/water mixture is retained in the inner space 265 can be increased as compared with a case in which the retention space 270 is not provided. Therefore, water vapor can be properly removed from the phosphoric acid aqueous solution/water mixture. As a result, the phosphoric acid aqueous solution/water mixture is substantially free from the water vapor and, in this state, spouted from the spout 268. This makes it possible to properly spout the phosphoric acid aqueous solution/water mixture from the phosphoric acid nozzle 218 in the form of continuous stream. Thus, the phosphoric acid aqueous solution/water mixture can be stably supplied to the substrate W2.

Further, the phosphoric acid nozzle 218 is partitioned into the lower space 272 including the retention space 270 and the upper space 273 including the gas outlet port 269 by the partition wall 271. Therefore, the phosphoric acid aqueous solution/water mixture flowing through the inner space 265 is substantially prevented from flowing out into the gas outlet line 251 through the gas outlet port 269.

The phosphoric acid aqueous solution/water mixture is retained in the retention space 270 for a relatively long period of time (not shorter than 0.1 second), so that a greater amount of water vapor can be removed from the phosphoric acid aqueous solution/water mixture. Thus, the phosphoric acid aqueous solution/water mixture is substantially free from the water vapor and, in this state, spouted from the phosphoric acid nozzle 218.

In the third embodiment, the single partition wall 271 is provided in the phosphoric acid nozzle 218 by way of example, but a plurality of partition walls may be provided in the phosphoric acid nozzle 218.

Figure 15:
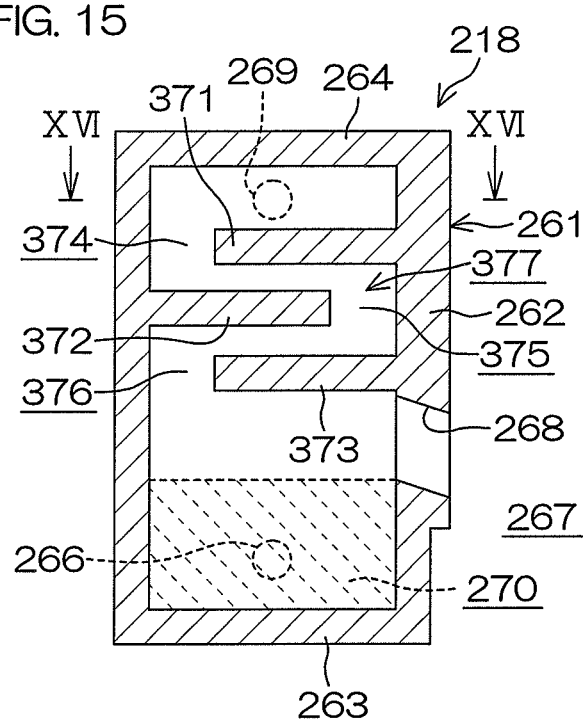
FIGS. 15 and 16 are sectional views schematically showing a modification of the phosphoric acid nozzle.
Figure 16:
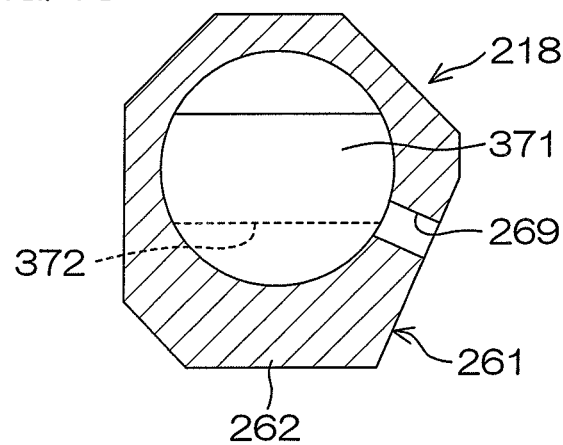

FIGS. 15 and 16 are sectional views schematically showing a modification of the phosphoric acid nozzle 218 (a modification of the phosphoric acid nozzle according to the third embodiment). FIG. 15 is a vertical sectional view, and FIG. 16 is a diagram taken along a sectional plane XVI-XVI in FIG. 15.

In the phosphoric acid nozzle 218 according to the modification shown in FIGS. 15 and 16, the casing 261 includes a first partition wall 371, a second partition wall 372 and a third partition wall 373 provided in this order from the upper side. The first to third partition walls 371, 372, 373 are each located at a lower position than the gas outlet port 269 above the retention space 270 in the inner space 265.

The partition walls 371, 372, 373 are D-shaped plates (each having a semicircular plate shape) each extending from the side wall portion 262, and their arcuate peripheral surfaces are each connected to the inner peripheral surface of the side wall portion 262. First, second and third openings 374, 375, 376 each having a crescent-shape (semicircular shape) are respectively defined by the D-shaped first, second and third partition walls 371, 372, 373. The partition walls 371, 372, 373 are arranged with the corresponding openings 374, 375, 376 being staggered. Therefore, a labyrinth-like flow passage 377 is defined between the upper space 273 and the lower space 272. The upper space 273 and the lower space 272 communicate with each other through the flow passage 377. Since the flow passage 377 has a labyrinth-like configuration, it is difficult for the phosphoric acid aqueous solution/water mixture present in the lower space 272 to flow into the upper space 273. Thus, the phosphoric acid aqueous solution/water mixture is reliably prevented from flowing out into the gas outlet line 251 through the gas outlet port 269.

In FIG. 15, the three partition walls 371, 372, 373 are provided by way of example, but the number of the partition walls may be two or four or more.

Figure 17:
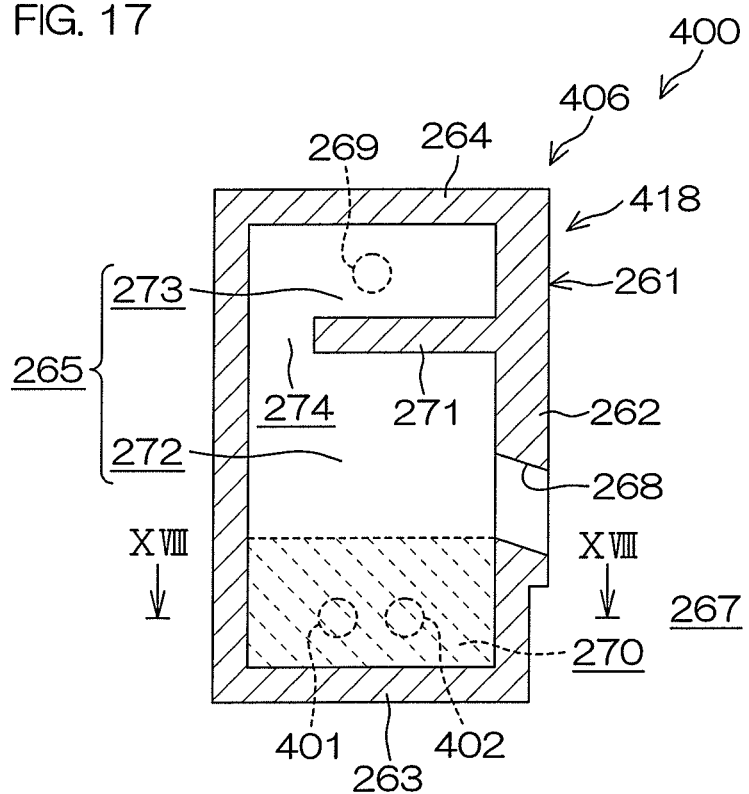
FIGS. 17 and 18 are sectional views schematically showing a phosphoric acid nozzle according to a fourth embodiment of the present invention.
Figure 18:
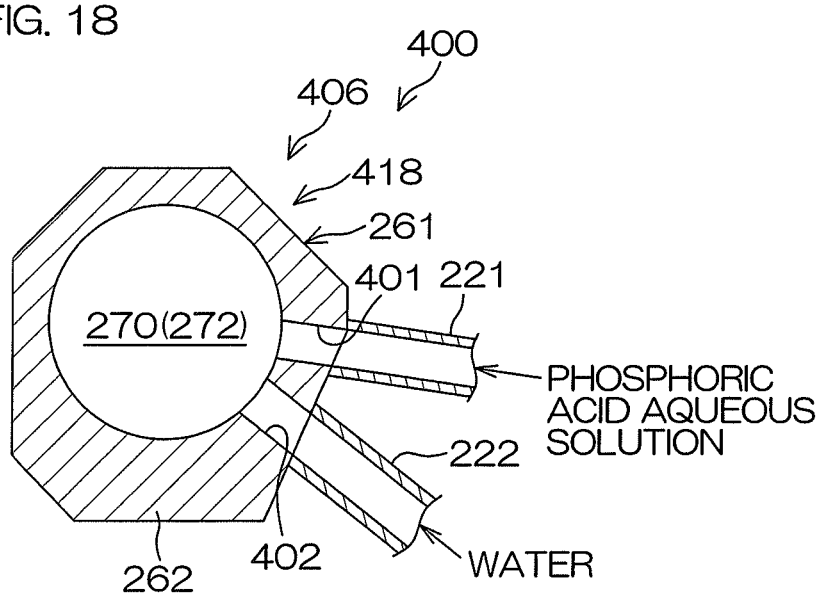

Next, a substrate treatment apparatus 400 according to a fourth embodiment of the present invention will be described. The substrate treatment apparatus 400 includes a phosphoric acid supplying device 406 instead of the phosphoric acid supplying device 206 according to the third embodiment. FIGS. 17 and 18 are sectional views schematically showing a phosphoric acid nozzle 418 according to the fourth embodiment of the present invention. FIG. 17 is a vertical sectional view, and FIG. 18 is a diagram taken along a sectional plane XVIII-XVIII in FIG. 17.

The phosphoric acid supplying device 406 includes a phosphoric acid nozzle 418 which spouts the phosphoric acid aqueous solution toward a substrate W2 held by the spin chuck 5 (see FIG. 9), a phosphoric acid tank 223 (see FIG. 9), a phosphoric acid line 221, and a water line 222. In the phosphoric acid supplying device 406, the phosphoric acid aqueous solution flowing through the phosphoric acid line 221 and the water flowing through the water line 222 do not flow through the mixing portion 220 (see FIG. 9) but are supplied directly to the phosphoric acid nozzle 418. Therefore, the phosphoric acid supplying device 406 does not include the liquid mixture line 219 (see FIG. 9). In FIGS. 17 and 18, components of the phosphoric acid nozzle 418 of the fourth embodiment corresponding to those of the phosphoric acid nozzle 218 of the third embodiment are designated by the same reference characters as in the third embodiment, and duplicate description will be omitted.

A single phosphoric acid inlet port (first liquid inlet port) 401 into which the phosphoric acid aqueous solution is fed from the phosphoric acid line 221 and a single water inlet port (second inlet port) 402 into which the water is fed from the water line 222 are provided in the lower portion of the side wall portion 262 of the casing 261 of the phosphoric acid nozzle 418.

The phosphoric acid inlet port 401 is a through-hole extending thicknesswise through the side wall portion 262. The one end of the phosphoric acid line 221 is connected to the phosphoric acid inlet port 401.

The water inlet port 402 is a through-hole extending thicknesswise through the side wall portion 262. The one end of the water line 222 is connected to the water inlet port 402. The phosphoric acid inlet port 401 and the water inlet port 402 are horizontally juxtaposed.

The phosphoric acid inlet port 401 and the water inlet port 402 are located at a lower position than the spout 268 in the side wall portion 262.

The phosphoric acid aqueous solution flowing through the phosphoric acid line 221 is supplied into the inner space 265 (more specifically, the lower space 272) through the phosphoric acid inlet port 401. The water flowing through the water line 222 is supplied into the inner space 265 (more specifically, the lower space 272) through the water inlet port 402.

The phosphoric acid aqueous solution and the water supplied into the lower space 272 flow through the inner space 265 toward the spout 268, while being retained in the retention space 270. The phosphoric acid aqueous solution and the water thus supplied are mixed together in the retention space 270. The phosphoric acid aqueous solution and the water vigorously react with each other, and the resulting liquid mixture of the phosphoric acid aqueous solution and the water experiences a bumping phenomenon. That is, water vapor is generated due to the mixing of the phosphoric acid aqueous solution and the water. Therefore, the phosphoric acid aqueous solution/water mixture flows through the retention space 270 in a state such that the mixture is mingled with the water vapor (in a water vapor containing state). At this time, the phosphoric acid aqueous solution/water mixture is retained in the retention space 270 for a predetermined period (not shorter than 0.1 second).

The water vapor contained in the phosphoric acid aqueous solution/water mixture is guided from the lower space 272 into the upper space 273. Due to the generation of the water vapor, the inner space 265 is maintained at a positive pressure. The gas outlet valve 252 is constantly open during the process sequence. Therefore, the generated water vapor is guided into the gas outlet line 251 through the gas outlet port 269 to be expelled from the other end of the gas outlet line 251.

Since the phosphoric acid aqueous solution/water mixture is retained in the retention space 270, the retention period during which the phosphoric acid aqueous solution/water mixture is retained in the inner space 265 can be increased as compared with the case in which the retention space 270 is not provided. Therefore, the water vapor can be properly removed from the phosphoric acid aqueous solution/water mixture. As a result, the phosphoric acid aqueous solution/ water mixture is substantially free from the water vapor and, in this state, spouted from the spout 268. This makes it possible to properly spout the phosphoric acid aqueous solution/water mixture in the form of continuous stream from the phosphoric acid nozzle 218, whereby the phosphoric acid aqueous solution/water mixture can be stably supplied to the substrate W2.

Figure 19:
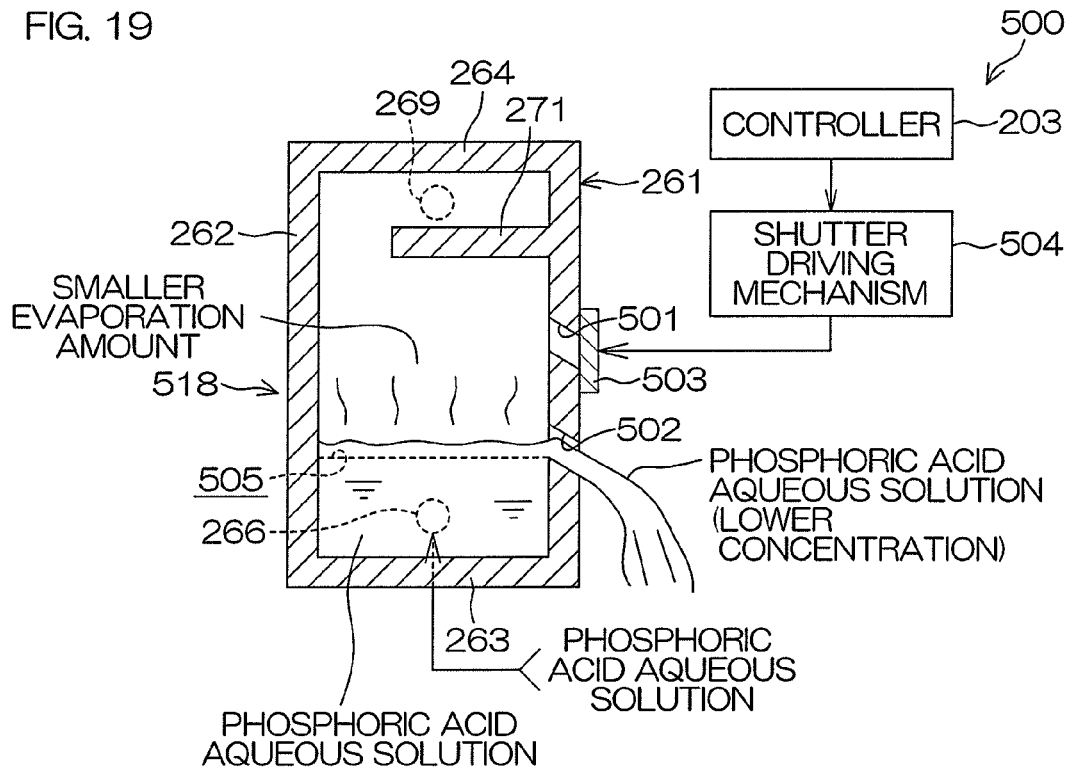
FIGS. 19 and 20 are schematic diagrams showing a phosphoric acid supplying device according to a fifth embodiment of the present invention.
Figure 20:
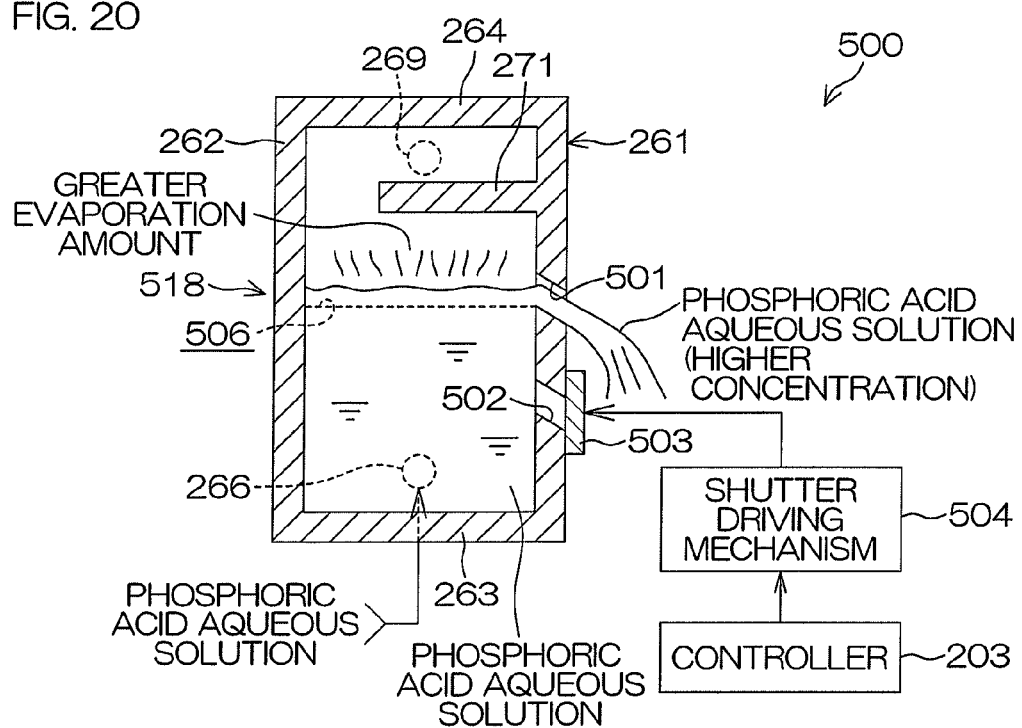

Next, a substrate treatment apparatus 500 according to a fifth embodiment of the present invention will be described. The substrate treatment apparatus 500 includes a phosphoric acid nozzle 518 instead of the phosphoric acid nozzle 218. FIGS. 19 and 20 are sectional views schematically showing the phosphoric acid nozzle 518 according to the fifth embodiment of the present invention. The phosphoric acid nozzle 518 is used instead of the phosphoric acid nozzle 218 according to the third embodiment. In FIGS. 19 and 20, components of the phosphoric acid nozzle 518 of the fifth embodiment corresponding to those of the phosphoric acid nozzle 218 of the third embodiment are designated by the same reference characters as in the third embodiment, and duplicate description will be omitted.

The phosphoric acid nozzle 518 differs from the phosphoric acid nozzle 218 in that two spouts (an upper spout (second liquid outlet port) 501 and a lower spout (first liquid outlet port) 502) are provided and that a shutter (retention space switching unit) 503 is provided which selectively opens the spouts 501, 502.

The upper spout 501 and the lower spout 502 are provided in the side wall portion 262 of the casing 261 of the phosphoric acid nozzle 518. The upper spout 501 and the lower spout 502 are arranged vertically in tandem at positions higher than the liquid mixture inlet port 266 and lower than the gas outlet port 269. The spouts 501, 502 are circumferentially offset about 90 degrees from the liquid mixture inlet port 266.

The upper spout 501 is a through-hole extending from the inner surface to the outer surface of the side wall portion 262. The upper spout 501 extends obliquely downward outward.

The lower spout 502 is a through-hole extending from the inner surface to the outer surface of the side wall portion 262. The lower spout 502 extends obliquely downward outward.

In FIGS. 19 and 20, the upper and lower spouts 501, 502 are illustrated as each having substantially the same diameter as the liquid mixture inlet port 266, but may each have a greater diameter than the liquid mixture inlet port 266.

The shutter 503 is adapted to selectively close the upper spout 501 and the lower spout 502 from the outside, and is vertically movable between an upper position at which the shutter 503 closes the upper spout 501 and a lower position at which the shutter 503 closes the lower spout 502. A shutter driving mechanism (retention space switching unit) 504 for moving up and down the shutter 503 is connected to the shutter 503.

A part of the inner space 265 of the casing 261 below the lower spout 502 is defined as a first retention space 505 (indicated by a broken line in FIG. 19) in which the phosphoric acid aqueous solution/water mixture fed into the inner space 265 can be retained. The first retention space 505 is a cylindrical space, and is capable of retaining the phosphoric acid aqueous solution/water mixture up to the height of the lower spout 502 which is an upper limit liquid level. The first retention space 505 has a volume of, for example, 2 cm$^3$. The volume of the first retention space 505 is such that, where the phosphoric acid aqueous solution/ water mixture is continuously supplied into the phosphoric acid nozzle 518, the phosphoric acid aqueous solution/water mixture flowing through the first retention space 505 is retained (temporarily stored) in the first retention space 505 for not shorter than 0.1 second (e.g., about 0.125 seconds).

A part of the inner space 265 of the casing 261 below the upper spout 501 is defined as a second retention space 506 (indicated by a broken line in FIG. 20) in which the phosphoric acid aqueous solution/water mixture fed into the inner space 265 can be retained. The second retention space 506 is a cylindrical space, and is capable of retaining the phosphoric acid aqueous solution/water mixture up to the height of the upper spout 501 which is an upper limit liquid level. The second retention space 506 has a greater volume than the first retention space 505.

When the shutter 503 is located at the upper position (see FIG. 19), the upper spout 501 is closed and the lower spout 502 is open. In this case, the phosphoric acid aqueous solution/water mixture is retained in the first retention space 505 of the inner space 265. The phosphoric acid aqueous solution/water mixture retained in the first retention space 505 is spouted from the lower spout 502.

When the shutter 503 is located at the lower position (see FIG. 20), on the other hand, the lower spout 502 is closed and the upper spout is open. In this case, the phosphoric acid aqueous solution/water mixture is retained in the second retention space 506 of the inner space 265. The phosphoric acid aqueous solution/water mixture retained in the second retention space is spouted from the upper spout 501.

When the phosphoric acid aqueous solution/water mixture is fed into the inner space 265 of the phosphoric acid nozzle 518 at a constant flow rate, the time (retention period) required for the phosphoric acid aqueous solution/water mixture to reach the upper spout 501 in the second retention space 506 defined in the inner space 265 is longer than the time (retention period) required for the phosphoric acid aqueous solution/water mixture to reach the lower spout 502 in the first retention space 505 defined in the inner space 265. Therefore, water is evaporated from the phosphoric acid aqueous solution/water mixture in a greater amount in the second retention space 506. That is, the phosphoric acid aqueous solution/water mixture retained in the second retention space 506 defined in the inner space 265 has a higher phosphoric acid concentration than the phosphoric acid aqueous solution/water mixture retained in the first retention space 505 defined in the inner space 265. Therefore, the retention space defined in the inner space 265 is switched selectively between the first and second retention spaces 505, 506 by moving the shutter 503 up and down to selectively close the spout 501 or 502. Thus, the concentration of the phosphoric acid aqueous solution to be spouted from the phosphoric acid nozzle 518 can be changed without controlling the flow rate adjusting valves 227, 232.

Immediately after the start of the phosphoric acid treatment step (Step S103 in FIG. 14), more specifically, the controller 203 opens the phosphoric acid line 221 and the water line 222 with the shutter 503 located at the lower position, whereby the higher concentration phosphoric acid aqueous solution is spouted from the upper spout 501 of the phosphoric acid nozzle 518. Thus, the higher concentration phosphoric acid aqueous solution is supplied to the upper surface of the substrate W2. After a lapse of a predetermined period of time, the controller 203 moves the shutter 503 to the upper position with the phosphoric acid line 221 and the water line 222 kept open. Thus, the phosphoric acid aqueous solution is spouted from the lower spout 502 of the phosphoric acid nozzle 518, whereby the concentration of the phosphoric acid aqueous solution to be spouted from the phosphoric acid nozzle 518 is switched to a lower concentration level.

In this manner, the higher concentration phosphoric acid aqueous solution is used only at the beginning of the phosphoric acid treatment step (Step S103 in FIG. 14). Then, the concentration of the phosphoric acid aqueous solution to be used for the etching is controlled so as to be reduced as the etching proceeds.

While the five embodiments of the present invention have thus been described, the invention may be embodied in other ways.

In the first embodiment, the mixing ratio between the phosphoric acid aqueous solution and the water in the phosphoric acid nozzle 18 is adjusted by the opening degree control by means of the water flow rate adjusting valve 30 by way of example. A phosphoric acid flow rate adjusting valve (mixing ratio adjusting unit) 25 (indicated by a two-dot-and-dash line in FIG. 1) may be provided in the phosphoric acid line 19 for changing the opening degree of the phosphoric acid line 19, and the mixing ratio between the phosphoric acid aqueous solution and the water in the phosphoric acid nozzle 18 may be adjusted by adjusting the flow rate of the phosphoric acid aqueous solution flowing into the phosphoric acid nozzle 18 by the opening degree control by means of the phosphoric acid flow rate adjusting valve 25. Alternatively, the mixing ratio between the phosphoric acid aqueous solution and the water in the phosphoric acid nozzle 18 may be adjusted by the opening degree control by means of the water flow rate adjusting valve 30 (mixing ratio adjusting unit) 30 as well as by the opening degree control by means of the phosphoric acid flow rate adjusting valve 25.

In the first embodiment, the phosphoric acid aqueous solution and the water are mixed together in the phosphoric acid nozzle 18 by way of example. Alternatively, the one end of the phosphoric acid line 19 and the one end of the water supply line 20 may be connected to a mixing portion connected to the phosphoric acid nozzle 18 through a pipe, and the phosphoric acid aqueous solution from the phosphoric acid line 19 and the water from the water supply line 20 may be mixed together in the mixing portion.

In the first embodiment, a phosphoric acid nozzle which spouts the phosphoric acid aqueous solution and a water nozzle which spouts the water may be separately provided with their spouts directed toward the upper surface of the substrate W1. In this case, the phosphoric acid aqueous solution and the water are mixed together on the upper surface of the substrate W1 to supply a phosphoric acid aqueous solution having a concentration adjusted to a predetermined concentration level on the upper surface of the substrate W1.

In the exemplary treatment process of FIG. 3 to be performed in the substrate treatment apparatus 1, 101, the phosphoric acid aqueous solution is continuously spouted from the phosphoric acid nozzle 18 in Steps S31, S32, S33 of the phosphoric acid treatment step S3, but the phosphoric acid aqueous solution may be intermittently spouted.

In the exemplary treatment process of FIG. 3 to be performed in the substrate treatment apparatus 1, 101, Steps S31, S32, S33 of the phosphoric acid treatment step S3 may be performed while suppressing the outflow of the phosphoric acid aqueous solution from the upper surface of the substrate W1 to retain the liquid film of the phosphoric acid aqueous solution on the upper surface of the substrate W1 (in a puddle state). If process steps involving the supply of phosphoric acid aqueous solutions having different concentrations are consecutively performed (e.g., the second step (S32) is followed by the third step (S33) in the exemplary treatment process of FIG. 3), the liquid film of the phosphoric acid aqueous solution needs to be removed from the substrate W1. In this case, the supply of the phosphoric acid aqueous solution onto the substrate W1 may be once stopped after the formation of the liquid film of the phosphoric acid aqueous solution on the substrate W1.

In the exemplary treatment process of FIG. 3 to be performed in the substrate treatment apparatus 1, 101, the substrate W1 may be treated with the lower concentration phosphoric acid aqueous solution without the use of the higher concentration phosphoric acid aqueous solution (a lower concentration phosphoric acid treatment may be performed) in the first step (S31) of the phosphoric acid treatment process (S3).

In the embodiments described above, the concentration of the higher concentration phosphoric acid aqueous solution to be used in the second step (S32) is set to about 86%, and the concentration of the lower concentration phosphoric acid aqueous solution to be used in the third step (S33) is set to about 82% by way of example. The phosphoric acid aqueous solution to be used in the third step (S33) is simply required to have a concentration lower than the concentration of the phosphoric acid aqueous solution to be used in the second step (S32).

In the fifth embodiment, the shutter 503 may be adapted to open and close only the lower spout 502.

The partition walls 371 to 373 according to the modification of the third embodiment shown in FIG. 15 may be applied to the nozzles 418, 518 according to the fourth and fifth embodiments.

The fifth embodiment may be combined with the fourth embodiment. That is, the arrangement in which the retention space defined in the inner space 265 is selectively switched between the first and second retention spaces 505, 506 by vertically moving the shutter 503 may be applied to the phosphoric acid nozzle 418 of the in-nozzle mixing type adapted to mix the phosphoric acid aqueous solution and the water together in the inner space 65.

In the phosphoric acid nozzles 218, 418, 518 according to the third to fifth embodiments, the spouts 268, 501, 502 are each provided as the liquid outlet port by way of example. The phosphoric acid nozzles 218, 418, 518 may each include a nozzle portion provided in the casing 61 as communicating with the inner space 265 through the liquid outlet port, and the present invention may be applied to such nozzles. In this case, the spout is provided at the distal end of the nozzle portion, and the liquid outlet port is separately provided.

In the exemplary treatment process of FIG. 14 to be performed in the substrate treatment apparatus 201, 400, 500, the phosphoric acid aqueous solution is continuously spouted from the phosphoric acid nozzle 218, 418, 518 in the phosphoric acid treatment step (S103), but may be intermittently spouted.

In the exemplary treatment process of FIG. 14 to be performed in the substrate treatment apparatus 201, 400, 500, the phosphoric acid treatment step (S103) may be performed while suppressing the outflow of the phosphoric acid aqueous solution from the upper surface of the substrate W2 to retain the liquid film of the phosphoric acid aqueous solution on the upper surface of the substrate W2 (in a puddle state). In this case, the supply of the phosphoric acid aqueous solution onto the substrate W2 may be once stopped after the formation of the liquid film of the phosphoric acid aqueous solution on the substrate W2.

Steps S1 to S9 shown in FIG. 3 may be performed on the substrate W1 (see FIG. 2) with the use of the substrate treatment apparatuses 201, 400, 500 according to the third to fifth embodiments.

In the third to fifth embodiments, the phosphoric acid aqueous solution and the water are used as the first liquid and the second liquid, respectively, in combination by way of example, but other exemplary combinations of the first and second liquids include a combination of sulfuric acid and a hydrogen peroxide aqueous solution (in this case, the resulting liquid mixture is SPM (sulfuric acid/hydrogen peroxide mixture)), and a combination of sulfuric acid and an ozone water (in this case, the resulting liquid mixture is ozone-containing sulfuric acid (liquid prepared by dissolving ozone gas in sulfuric acid)).

In the first to fifth embodiments, the semiconductor wafer (silicon wafer) is used as the substrate W1, W2 to be treated by way of example, but other exemplary substrates to be treated include glass substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

In the embodiments described above, the substrate treatment apparatuses 1, 101, 201, 400, 500 are each adapted to treat the disk-shaped substrate W1, W2 by way of example, but may be adapted to treat a polygonal substrate such as for a liquid crystal display device.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application Nos. 2013-256263 and 2013-256264 filed in the Japan Patent Office on Dec. 11, 2013, the disclosure of which is incorporated herein by reference in its entirety.

What is claimed is:

1. A substrate treatment method for treating a substrate including a first silicon nitride film provided on a front surface thereof and an upper silicon oxide film provided on the first silicon nitride film, to remove the first silicon nitride film and the upper silicon oxide film from the substrate, the method comprising:
    a substrate holding step of holding a substrate horizontally by a substrate holding unit provided in a chamber;
    a substrate rotating step of rotating the substrate held by the substrate holding unit about a predetermined vertically extending rotation axis;
    a concentration adjusting step of mixing phosphoric acid and water at a predetermined mixing ratio to set a first concentration of a phosphoric acid aqueous solution;
    a first phosphoric acid treatment step of causing the substrate holding unit to hold the substrate and discharging the phosphoric acid aqueous solution having the first concentration from a nozzle to the substrate held by the substrate holding unit in the chamber to etch the front surface of the substrate with the first concentration phosphoric acid aqueous solution while rotating the substrate;
    a concentration changing step of changing the mixing ratio of the phosphoric acid and water to change the concentration of the phosphoric acid aqueous solution discharged from the nozzle to a second concentration which is lower than the first concentration; and
    continuously following the first phosphoric acid treatment step, a second phosphoric acid treatment step of supplying the phosphoric acid aqueous solution having the second concentration to the substrate held by the substrate holding unit in the chamber, to etch the front surface of the substrate with the second concentration phosphoric acid aqueous solution while continuing to rotate the substrate.

2. The substrate treatment method according to claim 1, wherein
    the substrate held by the substrate holding unit is a semiconductor substrate in which the first silicon nitride film is provided as a side wall film on a lateral side of a gate electrode of silicon on a lower silicon oxide film provided on the front surface of the substrate, and the upper silicon oxide film is provided over the gate electrode and the first silicon nitride film, and
    the first phosphoric acid treatment step includes etching both a portion of the lower silicon oxide film which is not covered by the gate electrode or the first silicon nitride film, and the upper silicon oxide film.

3. The substrate treatment method according to claim 2, wherein the substrate further includes a second silicon nitride film provided on the upper silicon oxide film,
    the method further comprising a higher concentration phosphoric acid treatment step of supplying a phosphoric acid aqueous solution having a concentration higher than the second concentration to the substrate to treat the substrate with the higher concentration phosphoric acid aqueous solution for removal of the second silicon nitride film before the first phosphoric acid treatment step.

4. The substrate treatment method according to claim 2, wherein the substrate further includes a second silicon nitride film provided on the upper silicon oxide film,
    the method further comprising a lower concentration phosphoric acid treatment step of supplying a phosphoric acid aqueous solution having a concentration lower than the first concentration to the substrate to treat the substrate with the lower concentration phosphoric acid aqueous solution for removal of the second silicon nitride film before the first phosphoric acid treatment step.

* * * * *